US006403462B1

(12) United States Patent
Hasunuma et al.

(10) Patent No.: US 6,403,462 B1
(45) Date of Patent: Jun. 11, 2002

(54) METHOD FOR MANUFACTURING HIGH RELIABILITY INTERCONNECTION HAVING DIFFUSION BARRIER LAYER

(75) Inventors: Masahiko Hasunuma, Yokohama; Hisashi Kaneko, Fujisawa; Shohei Shima; Sachiyo Ito, both of Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/321,848

(22) Filed: May 28, 1999

(30) Foreign Application Priority Data

May 29, 1998 (JP) .......................................... 10-149211
May 26, 1999 (JP) .......................................... 11-145848

(51) Int. Cl.[7] .......................................... H01L 21/4763
(52) U.S. Cl. ........................ 438/622; 438/642; 438/653
(58) Field of Search ................................. 438/622, 642, 438/652, 653, 660, 663, 658, 687, 688; 257/767, 750, 751, 762, 765

(56) References Cited

U.S. PATENT DOCUMENTS

| | | | | |
|---|---|---|---|---|
| 4,057,824 A | * | 11/1977 | Woods ........................ | 357/56 |
| 4,529,621 A | * | 7/1985 | Ballard ........................ | 427/95 |
| 4,989,064 A | * | 1/1991 | Kubokoya et al. ............. | 357/67 |
| 5,382,831 A | * | 1/1995 | Atakov et al. ............... | 257/767 |
| 5,428,233 A | * | 6/1995 | Walczyck .................... | 257/273 |
| 5,488,013 A | * | 1/1996 | Geffken et al. ............. | 438/643 |
| 5,689,139 A | * | 11/1997 | Bui et al. .................... | 257/758 |
| 5,712,510 A | * | 1/1998 | Bui et al. .................... | 257/758 |
| 5,744,733 A | * | 4/1998 | Bridenbaugh et al. ..... | 73/865.6 |
| 5,821,168 A | * | 10/1998 | Jain ............................ | 438/692 |
| 5,858,819 A | * | 1/1999 | Miyasaka .................... | 438/149 |
| 5,900,735 A | * | 5/1999 | Yamamoto ................... | 324/537 |
| 5,953,628 A | * | 9/1999 | Kawaguchi ................. | 438/635 |
| 5,953,634 A | * | 9/1999 | Kajita et al. ................ | 438/687 |
| 5,981,378 A | * | 11/1999 | Bothra ........................ | 438/637 |
| 6,001,730 A | * | 12/1999 | Farkas et al. ................ | 438/627 |
| 6,012,336 A | * | 1/2000 | Eaton et al. ................... | 73/754 |
| 6,043,145 A | * | 3/2000 | Suzuki et al. ............... | 438/622 |

FOREIGN PATENT DOCUMENTS

| | | | | |
|---|---|---|---|---|
| JP | 53009470 | * | 1/1978 | ........... H01L/23/54 |
| JP | 05-121407 | | 10/1991 | |
| JP | 05-136137 | | 11/1991 | |
| JP | 06-209002 | | 1/1993 | |
| JP | 405136137 | * | 6/1993 | ....... H01L/21/3205 |
| JP | 06-168942 | | 8/1993 | |
| JP | 410135298 | * | 10/1996 | ........... H01L/21/66 |
| JP | 10-229086 | | 2/1997 | |
| JP | 410229086 | * | 8/1998 | ....... H01L/21/3205 |

OTHER PUBLICATIONS

Blech, I.A., "Electromigration in thin aluminum films on titanium nitride," Journal of Applied Physics, vol. 47, No. 4, Apr. 1976.

* cited by examiner

Primary Examiner—Olik Chaudhuri
Assistant Examiner—Ginette Peralta
(74) Attorney, Agent, or Firm—Finnegan, Henderson, Farabow, Garrett & Dunner, L.L.P.

(57) ABSTRACT

A semiconductor device manufacturing method of the this invention having the step of forming an interlayer insulating film on a semiconductor substrate, the step of making interconnection groove in the interlayer insulating film, the step of filling the inside of the interconnection groove with a conductive film which is made of a first substance and is thicker than the depth of the interconnection groove, the step of thermally stabilizing the size of crystal grains in an Al film either at the same time or after the Al film has been formed, the step of forming a Cu film on the Al film, the step of selectively forming θ phase layers in a crystal grain boundary of the Al film by causing Cu to selectively diffuse into the crystal grain boundary of Al film and of allowing the θ phase layers to divide the Al film in the interconnection groove into fine Al interconnections shorter than the Blech critical length, and the step of removing the Al film and Cu film outside the interconnection groove.

44 Claims, 10 Drawing Sheets

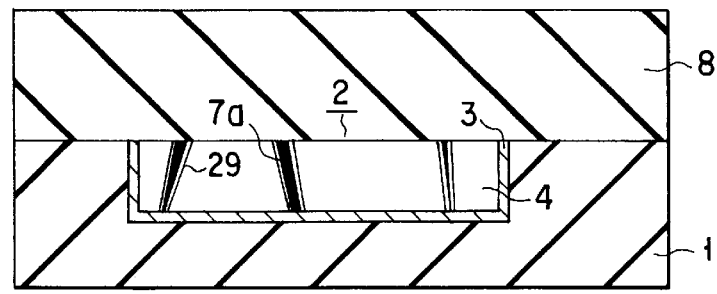
FIG. 1F
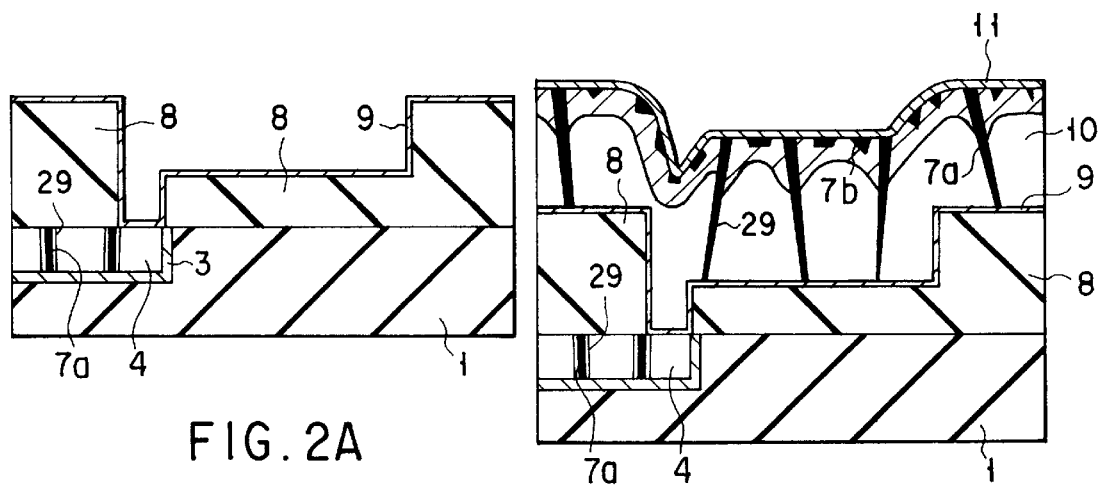
FIG. 2A
FIG. 2B
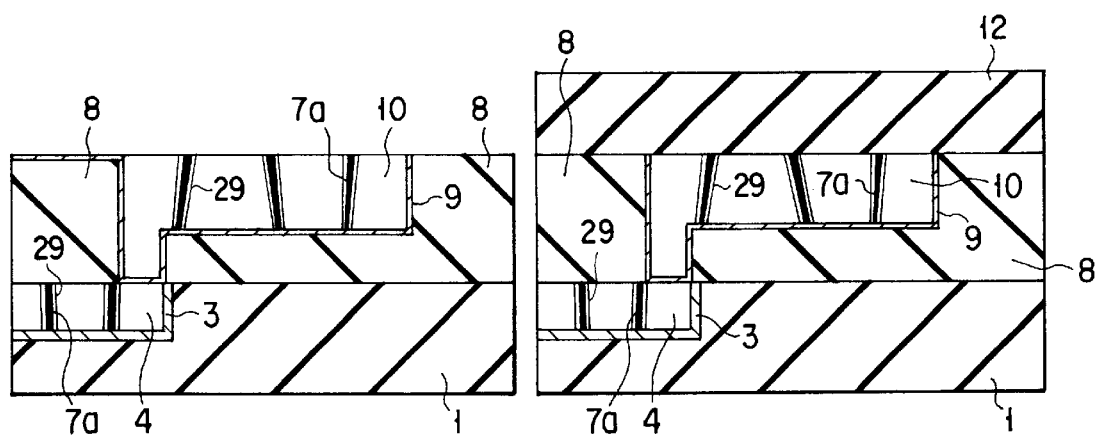
FIG. 2C
FIG. 2D

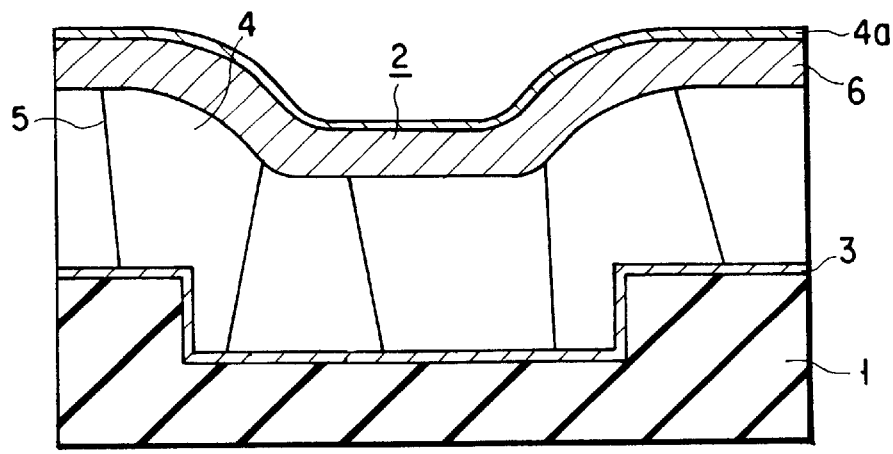
F I G. 6C
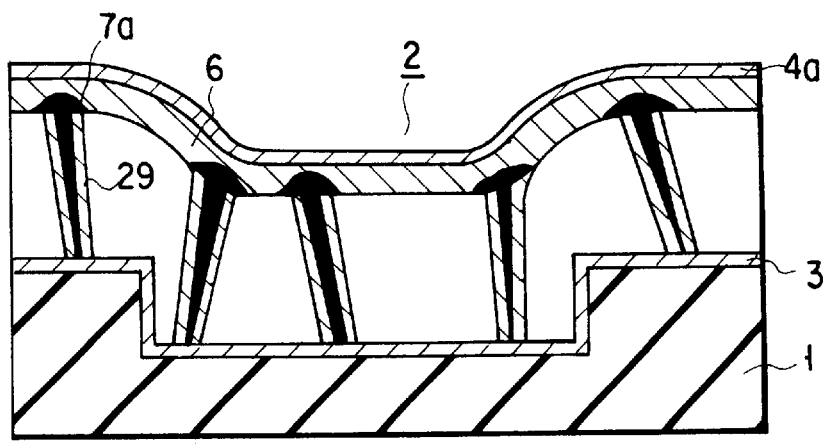
F I G. 6D
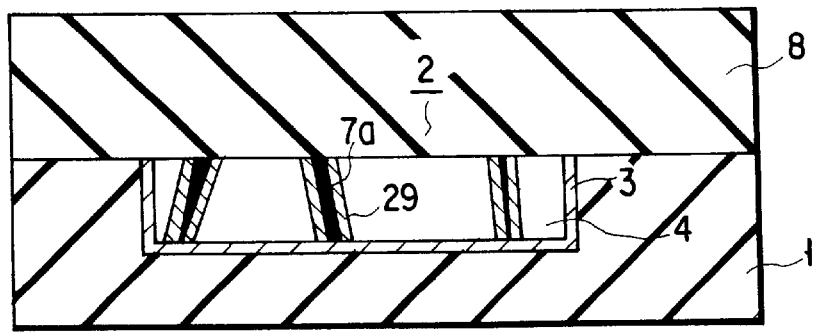
F I G. 6E

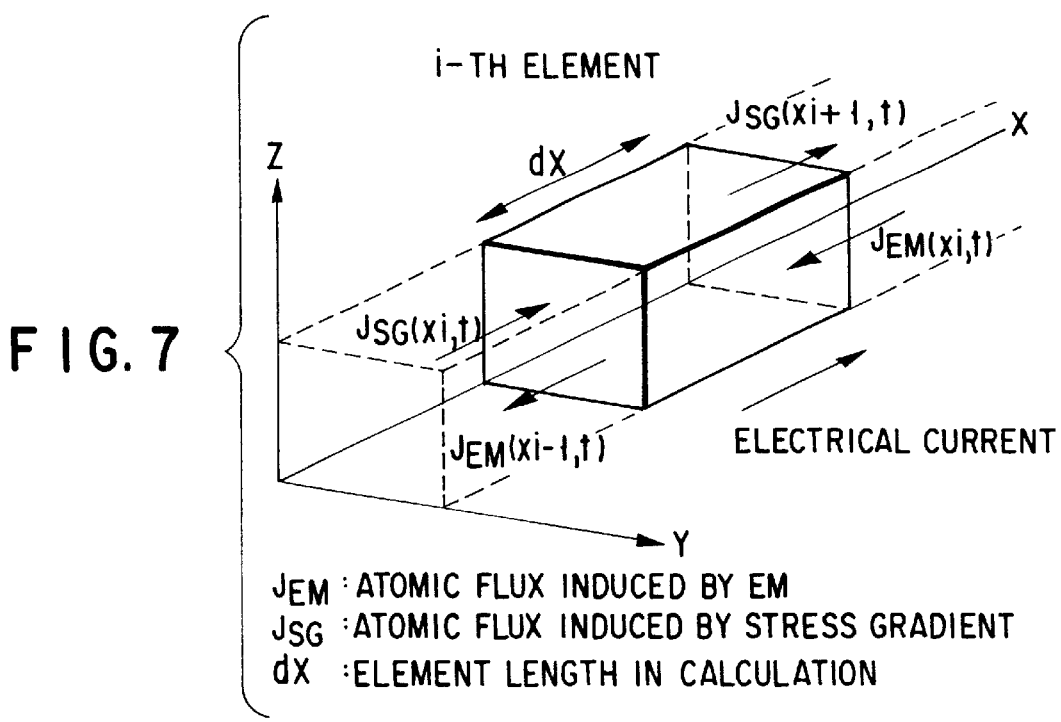
F I G. 7
$J_{EM}$ : ATOMIC FLUX INDUCED BY EM
$J_{SG}$ : ATOMIC FLUX INDUCED BY STRESS GRADIENT
$dX$ : ELEMENT LENGTH IN CALCULATION
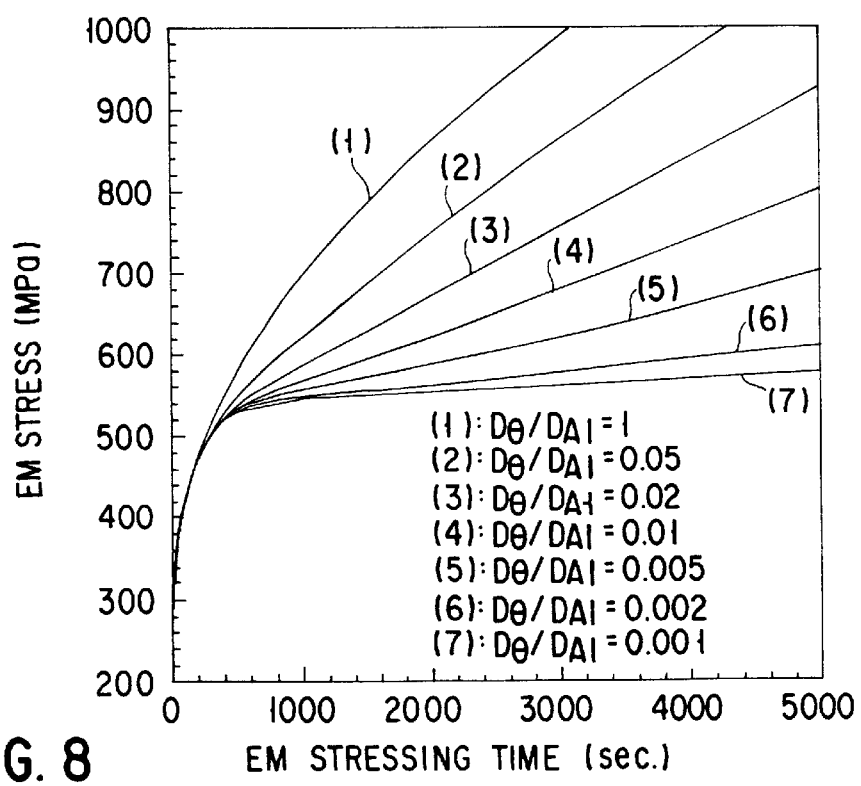
(1): $D_\theta/D_{Al} = 1$
(2): $D_\theta/D_{Al} = 0.05$
(3): $D_\theta/D_{Al} = 0.02$
(4): $D_\theta/D_{Al} = 0.01$
(5): $D_\theta/D_{Al} = 0.005$
(6): $D_\theta/D_{Al} = 0.002$
(7): $D_\theta/D_{Al} = 0.001$
F I G. 8

METHOD FOR MANUFACTURING HIGH RELIABILITY INTERCONNECTION HAVING DIFFUSION BARRIER LAYER

BACKGROUND OF THE INVENTION

This invention relates to a method of manufacturing semiconductor devices.

As recent semiconductor devices increase in circuit density and performance, interconnections are getting finer and making more use of multilevel structures. Aluminum, Al, has been used as a material for interconnection because it is easy to work and has a relatively low resistance.

The finer interconnections and multilevel structures have given rise to an interconnection problem. Specifically, as interconnections become finer, the cross-sectional area of the interconnection becomes increasingly small. Since no measure has been taken to reduce the signal current, the current density has been increasing, permitting electromigration (EM) to give rise to broken wires or short circuits, which becomes a serious problem.

To solve the problem, a method has been proposed. In the method, diffusion barrier layers against Al are formed in the Al interconnections and the Al interconnections are divided into fine interconnections shorter than the Blech critical length.

The method is based on the fact that when an interconnection is shorter than a specific length, or the Blech critical length, the diffusion of atoms due to the stress gradient in the interconnection is balanced against the diffusion of atoms by current wind, preventing Al atoms from drifting by EM (refer to I. A. Blech, E. Kinsborn, "Thin Solid Films," 25, 337, 1975).

In the method, a Cu film is deposited on an Al interconnection embedded in an interconnection groove. Next, Cu or AlCu compound in the Cu film is diffused throughout the Al interconnection by a heat treatment. Then, Cu is allowed to precipitate in the Al crystal grain boundary, which causes diffusion barrier layers to divide the Al interconnection into fine Al interconnections shorter than the Blech critical length.

BRIEF SUMMARY OF THE INVENTION

An object of the present invention is to provide a semiconductor device manufacturing method which enables the formation of highly electromigration-resistant and stress-migration-resistant interconnection divided into fine interconnections shorter than the Blech critical length without increasing the interconnection resistance.

The foregoing object is accomplished by providing a semiconductor device manufacturing method having the steps of: forming an interlayer insulating film on a semiconductor substrate; making a connection hole in the interlayer insulating film; filling an inside of the connection hole with a conductive film which is made of a first substance, is thicker than the depth of the connection hole, and has a crystal grain boundaries; forming on the conductive film a diffusion source film which is made of a second substance and to be a diffusion barrier layer against the first substance; forming a diffusion barrier layer in the connection hole against the first substance in the crystal grain boundary by causing the second substance to selectively diffuse into the crystal grain boundary at the same time or after the time of formation of the conductive film so as to the diffusion barrier layer to divide the conductive film into regions shorter than the Blech critical length; and removing the conductive film and the diffusion source film outside the connection hole to form an interconnection composed of the conductive film in the connection hole.

With the present invention, the inside of the connection holes are filled with the conductive film made of the first substance acting as interconnections thicker than the depth of the connection holes. This prevents the second substance from precipitating in the crystal grain in the conductive film in the connection holes even when the second substance has precipitated at high concentration in the crystal grain in the conductive film outside the connection holes in diffusing the second substance (material for the diffusion barrier layer). On the other hand, the diffusion barrier layer can be formed as far as the bottom of the connection holes, making use of the fact that the diffusion of the second substance in the crystal grain boundary (grain boundary diffusion) is faster than the diffusion in the crystal grain (volume diffusion).

Specifically, for the conductive film in the connection holes, the second substance is allowed to selectively precipitate in the crystal grain boundary, which prevents the second substance from precipitating in the crystal grain. The precipitation of the second substance in the crystal grain contributes to an increase in the interconnection resistance. Consequently, with the present invention, it is possible to form highly electromigration-resistant fine interconnections without increasing the interconnection resistance.

On the other hand, stress-migration due to the difference in thermal expansion coefficient between the interconnection and the interlayer insulating film is such a faulty interconnection as a broken interconnection caused by the diffusion of vacancies into a void earlier formed and the accumulation of vacancies in the void.

Such a faulty interconnection can be prevented by suppressing the long-distance diffusion of voids. In the present invention, the second substance is caused to diffuse into the crystal grain boundary and diffusion barrier layers made of the second substance are allowed to divide the interconnection into fine interconnections. Because the diffusion barrier layers suppress the long-distance diffusion of voids, stress-migration can be prevented. As explained earlier, the formation of such diffusion barrier layers leads to no increase in the interconnection resistance. Therefore with the present invention, the stress-migration resistance of interconnections can be also increased, without increasing the interconnection resistance.

Another object of the present invention is to provide a semiconductor device capable of increasing the electromigration of interconnection, regardless of the interconnection structure (a damascene structure or an RIE structure).

The foregoing object is accomplished by providing a semiconductor device having a semiconductor substrate in which an element is formed; and an interconnection formed on the semiconductor substrate and connected to the element, wherein the interconnection is formed of fine interconnections divided by diffusion barrier layers so as to be shorter than the Blech critical length, the diffusion barrier layers are made of a material including a main component element of the fine interconnections which acts as a diffusion barrier against the main component element of the fine interconnections, and an expression is fulfilled: $(D_B/D_{line})/L_W \leq 0.1$, where $D_B$ is a mutual diffusion coefficient of the main component element in the diffusion barrier layers, $D_{line}$ is a self diffusion coefficient of the main component element and $L_W$ [μm] is an average layer thickness of the diffusion barrier layers in the longitudinal direction of the interconnection.

The inventors' research has shown that if the above conditions are fulfilled, the electromigration resistance of interconnections can be increased, regardless of the interconnection structure, as described in detail in the embodiments below. Therefore with the present invention, the electromigration resistance of interconnections can be increased, regardless of the interconnection structure. And the diffusion barrier layer also suppress the long-distance diffusion of voids, high stress-migration-resistant can be achieved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A to 1F are sectional views showing the first half of a method of manufacturing semiconductor devices according to a first embodiment of the present invention;

FIGS. 2A to 2D are sectional views showing a method of manufacturing semiconductor devices according to a third embodiment of the present invention;

FIGS. 6A to 6E are sectional views showing a method of manufacturing semiconductor devices according to a thirteenth embodiment of the present invention;

FIG. 7 shows an element model of interconnection used in simulation;

FIG. 8 shows the relationship between the EM stress at the cathode end and the EM stressing time when the thickness of the θ phase layer is 0.5 $\mu$m;

DETAILED DESCRIPTION OF THE INVENTION

Hereinafter, referring to the accompanying drawings, embodiments of the present invention will be explained.

First Embodiment

Before explanation of embodiments of the present invention, the problems of a conventional equivalent the inventors have found will be described.

The mentioned forming method has the following problem: the diffusion permits Cu to appear in solid solution and precipitate at high concentration not only in the Al crystal grain boundary but also within the Al crystal grains, resulting in an increase in the resistance of the interconnection.

The precipitation of Cu in the Al crystal grains takes place as a result of the formation of AlCu compounds in defects at the surface of the Al interconnection caused in embedding the Al interconnection by CMP techniques, which causes the problem of increasing the interconnection resistance.

The precipitation of Cu in the Al crystal grains prevents a sufficient amount of Cu from precipitating in the Al crystal grain boundary, suppressing the formation of a diffusion barrier layer, which prevents EM resistance from being improved. Moreover, the Cu precipitated in the Al crystal grains can be the starting point from which flux divergence will begin in the conductive state, decreasing the EM resistance.

Embodiments capable of solving such problems will be explained. FIGS. 1A to 1F are sectional views showing a semiconductor device manufacturing method according to a first embodiment of the present invention.

Figure 1A:
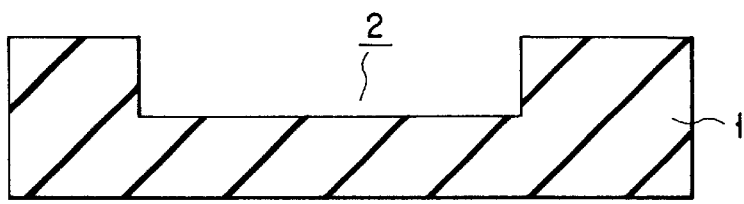

As shown in FIG. 1A, after an interlayer insulating film 1 of $SiO_2$ has been formed on a silicon substrate (not shown) in which elements have been formed integrally, an interconnection groove 2 with a width of 0.4 $\mu$m and a depth of 0.4 $\mu$m and a 0.35-$\mu$m-diameter via hole (not shown) are made at the surface of the interlayer insulating film 1 by PEP and RIE techniques. Thereafter, the via hole is filled with a W film (W via). The w via is connected to the elements.

Figure 1B:
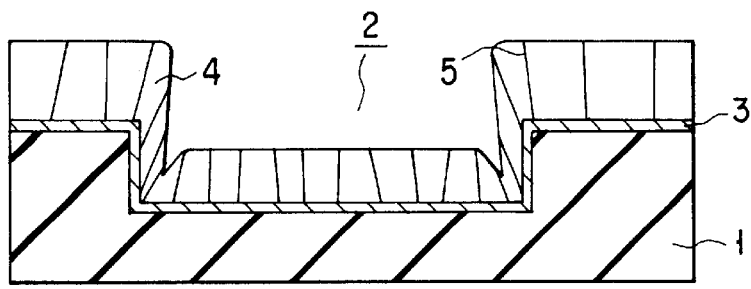

Next, after the silicon substrate has been introduced into the chamber of a sputtering unit, a TiN film 3 is formed on the surface of the interlayer insulating film 1 by sputtering as shown in FIG. 1B. Then, a 400-nm-thick Al film (a first-layer Al film) 4 to become Al interconnection is formed on the whole surface by highly anisotropic sputtering techniques with the distance between the sputtering target and the substrate being set long.

The Al film 4 is a pure Al film to which no impurity, such as Cu, has been added. It is assumed that the degree of vacuum in the chamber in forming the Al film 4 is, for example, $5\times10^{-6}$ Pa and the Ar (sputtering particle) pressure in the chamber is, for example, $3\times10^{-1}$ Pa. In the figure, numeral 5 indicates the crystal grain boundary of the Al film 4.

Figure 1C:
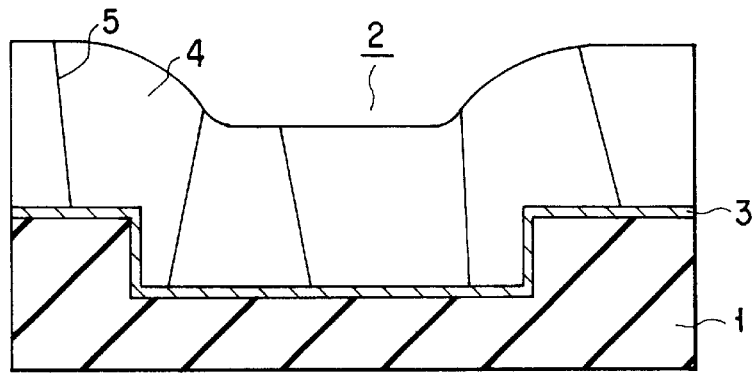

As shown in FIG. 1C, another 400-nm-thick Al film (a second Al film) 4 acting as an Al interconnection is formed on the whole surface in another chamber in the same unit without breaking the vacuum, while the silicon substrate is being heated at a temperature as high as 450° C. (by reflow sputtering techniques). The resulting Al film 4 is also a pure Al film.

The TEM(Transmission Electron Microscope) analysis of the specimen obtained in that state showed that, as a result of the formation of the second Al film 4 at the high temperature, the crystal grains had grown to have a diameter ranging from 2 to 8 $\mu$m and been thermally stable and the Al film 4 in the interconnection groove 2 had a bamboo structure with few grain boundary triple points.

Figure 1D:
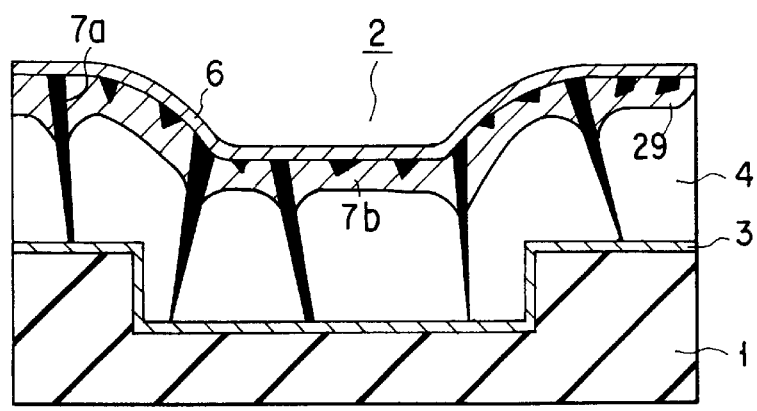

As shown in FIG. 1D, a 100-nm-thick Cu film 6 is formed on the Al film 4 at a film forming speed of 1 nm/sec in another chamber in the same unit without breaking the vacuum, after the silicon substrate has been heated and the substrate temperature (film forming temperature) has become high. The resulting Cu film 6 is also a pure Cu film.

The TEM analysis of the specimen at this stage showed that a θ phase layer ($CuAl_2$ layer) 7a, a diffusion barrier layer, was formed in the crystal grain boundary of the Al film 4 and a θ phase layer 7b was formed in the crystal grain of the Al film 4. The film forming temperature for the specimen was 250° C.

The θ phase layer 7a formed in the crystal grain reached the bottom of the interconnection groove 2 and the distance between θ phase layers 7a was less than 30 μm, and shorter than the Blech critical length (250° C., $2MA/cm^2$ conditions). Generally, the Blech length increases in inverse proportion to the current density. Therefore, when the Blech length is not reached under the practical use conditions, the serviceability becomes very high.

On the other hand, the θ phase layer 7b was formed only on the surface of the Al film 4 and the θ phase layer 7b and a Cu solid solution layer 29 had not reached the inside of the interconnection groove 2. When the film forming temperature of the Cu film 6 was above 400° C., the θ phase layer 7b reached the inside of the interconnection groove 2. The Cu solid solution layer 29 advanced further into the inside of the crystal grain.

Figure 1E:
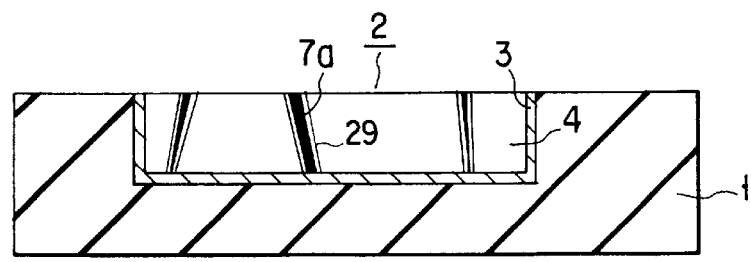

Next, as shown in FIG. 1E, an Al interconnection 4 is divided by θ phase layers 7a into fine Al interconnections shorter than the Blech critical length and the fine Al interconnections are embedded in the interconnection groove 2 by grinding and removing the Al film 4 and Cu film 6 outside the interconnection groove 2 by CMP techniques using a slurry of Cu (e.g., quinaldic acid, hydrogen peroxide, colloidal silica, or water). The Al interconnections 4 are electrically connected to the elements integrally formed in the silicon substrate by the W via (not shown). Thereafter, the substrate is washed.

Since the θ phase layer 7b and Cu solid solution layer 29 formed in the crystal grain on the surface of the Al film 4 has been removed, there is no θ phase layer 7b in the crystal grain of the Al interconnection 4. The θ phase layer 7b contributes to an increase in the interconnection resistance.

The EDX (energy dispersive x-ray spectroscopy) analysis of the Cu concentration in the Al interconnections 4 showed that the average concentration was 10 wt %. The point analysis of the inside of the crystal grain showed that the average concentration was 1 wt % at a film forming temperature of 400° C. It is apparent from the result of the analysis that a large amount of Cu has segregated in the form of a diffusion barrier layer, such as a θ phase layer 7a or Cu concentrated layer. That is, it is apparent that the Al interconnections 4 have been divided by diffusion barrier layers composed of θ phase layers 7a or Cu concentrated layers or both of these layers into fine Al interconnections shorter than the Blech critical length.

Finally, as shown in FIG. 1F, a 800-nm-thick passivation film 8 is formed on the whole surface.

Before the formation of the passivation film 8, the surface of the Al interconnections 4 are treated by oxygen plasma processing.

The oxygen plasma process is for improving the hillock resistance by forming a thin oxide film (not shown) on the surface of the θ phase layers 7a to equalize the state of the oxide film on the surface of the Al interconnections 4.

The thin film oxide film may be formed by a method other than the oxygen plasma process. For instance, the thin film may be formed by introducing oxygen gas before the introduction of Si family gas to form a passivation film 8. In this case, it is desirable that the oxidizing process temperature should be low, for example, 300° C. or below, preferably 250° C. or below.

As described above, with the first embodiment, θ phase layers 7b and Cu solid solution layer 29, which contribute to an increase in the interconnection resistance, need not be formed in the crystal grains of the Al interconnections 4. This prevents the interconnection resistance from increasing, which achieves the highly electromigration-resistant Al interconnections 4 divided into fine Al interconnections shorter than the Blech critical length without increasing the interconnection resistance.

The inventors formed specimens at various film forming temperature of the Cu film 6 in the above manufacturing method and measured the resistance of the Al interconnections 4 of each specimen by a four-terminal method.

Furthermore, the inventors evaluated the EM resistance of the Al interconnection 4 for each specimen by a conducting test at 225° C. with $2 MA/cm^2$. The test interconnections were terminated at both ends with the W via and connected to four terminal pad via the W via. In the figure, the mark X indicates that the breaking of an interconnection has occurred in shorter than 100 hours, a single circle indicates that the breaking of an interconnection has occurred in equal to or longer than 100 hours but shorter than 200 hours, and a double circle indicates that the breaking of an interconnection has not occurred even when 200 hours or more have elapsed.

Additionally, a high temperature storage test was conducted by storing the Al interconnections whose total length was 30 mm at 400° C. for 20 minutes. The evaluation of the test was made on the basis of the number of hillocks occurred after the high temperature storage test, more precisely, the number of 500-nm or more diameter hillocks for every 1-mm-long interconnection.

The results thus obtained are listed in Table 1. For comparison's sake, Table 1 also lists the results of evaluating an embedded interconnection composed of a Al-0.5 wt % Cu alloy film serving as an interconnection conducting film and a Cu-added Al alloy film formed using reflow sputtering techniques as a film forming method.

TABLE 1

| Cu FILM FORMING SUBSTRATE TEMPERATURE | R.T. | 100° C. | 150° C. | 200° C. | 250° C. | 300° C. | 350° C. | 400° C. | SAMPLE MATERIAL |
|---|---|---|---|---|---|---|---|---|---|
| INTERCONNECTION RESISTIVITY (μΩcm) | 2.7 | 2.7 | 2.7 | 2.8 | 2.9 | 2.9 | 2.9 | 3.1 | 3.1 |
| EM RESISTANCE | X | X | ○ | ○ | ◎ | ◎ | ◎ | ◎ | X |

TABLE 1-continued

| Cu FILM FORMING SUBSTRATE TEMPERATURE | R.T. | 100° C. | 150° C. | 200° C. | 250° C. | 300° C. | 350° C. | 400° C. | SAMPLE MATERIAL |
|---|---|---|---|---|---|---|---|---|---|
| HIGH TEMPERATURE STORAGE TEST RESULT | 20 | 18 | 10 | 10 | 5 | 0 | 0 | 0 | 10 |

R.T. : ROOM TEMPERATURE

It is seen from Table 1 that when the film forming temperature (Cu film forming temperature) of the Cu film 6 is as high as 150° C. or higher, the EM resistance is improved and that when it is as high as 250° C. or higher, the EM resistance is improved very much. The reason is that the formation of the Cu film 6 at high temperatures allows Cu in the Cu film 6 to precipitate in the crystal grain boundary of the Al film 4, which forms a diffusion barrier layer (a θ phase layer 7a or a Cu concentrated layer 29 or both of these) against Al.

Moreover, it is found from Table 1 that although the EM resistance does not deteriorate even at a high temperature of 400° C., the interconnection resistance increases. The reason is that, at a temperature as high as 400° C. or above, a θ phase layer 7b is formed even in the crystal grain of the Al film 4 in the interconnection groove 2. It is understood, however, that at a temperature below 350° C., neither the deterioration of the EM resistance nor the increase of the interconnection resistance takes place.

From the above results, it is understood that the favorable temperature range of the Cu film forming temperature is 150° C. or above but 400° C. or below, preferably 250° C. or above but 350° C. or below. Moreover, it is found that, in the preferable temperature range, the result of the high temperature storage test was good and the occurrence of hillocks was suppressed sufficiently. In other words, stress-migration(SM) resistance increases sufficiently. The reason is that the diffusion barrier layer has suppressed the long distance diffusion of Al sufficiently.

In addition, when a similar Cu film was formed on an Al film formed without heating, Cu did not diffuse into the crystal grain boundary of the Al film. Moreover, when the Al film was put to an EM test, it was broken within 20 hours. The reason is that since the Al crystal grain grew at the same time that the Cu film grew, Cu was unable to go deep into the crystal grain boundary of the Al film.

Accordingly, before the formation of the Cu film, the crystal grain of the Al film must grow sufficiently. That is, the size of the crystal grain must be stable thermally. The Al film has to be heat-treated at least at a temperature higher than the film forming temperature (the Cu doping temperature).

While in the first embodiment, the crystal grain is grown in the course of the formation of the Al film by the thermal formation (reflow sputtering) of the Al film, it may be grown by another method. For instance, the crystal grain may be grown by heating the Al film after the formation of the Al film.

While in the first embodiment, the reflow Al film using pure Al has been explained, a reflow Al film using Al with a Si content of about 1% and a Cu content of 0.5% to several percents may be used, which produces a similar effect.

Furthermore, while in the first embodiment, a film (Cu film) composed of a single element (Cu) has been used as a diffusion source film, another film may be used. For instance, a film composed of more than one element, such as Al—Cu alloy, may be used, which produces a similar effect. In this case, it is desirable that the Cu concentration should be 33 at. % or more.

While in the embodiment, the Al film 4 and Cu film 6 have been formed by the sputtering techniques, other methods may be used. For instance, a resistive heating evaporation method, ICB method, or MOCVD method may be used. If contamination ascribable to the processes can be prevented, a force filling method may be used.

The study of the inventors has shown that use of a film forming method with high incoming particle energy, such as a self-sustaining sputtering method, enables the process temperature of the diffusion barrier layer to be lowered.

While in the first embodiment, the Al interconnections 4 have been formed directly in the interconnection groove 2, the Al interconnections may be formed after a foundation film, such as a barrier film (e.g., a TiN film, Ti film, TiN/Ti film, or TiW film) or an Al reflow liner film (e.g., a Ta film, Nb film, or TaAl film), has been formed in the interconnection groove 2.

Second Embodiment

By the manufacturing method explained in the first embodiment, a semiconductor device having the structure of FIG. 1F is formed. The Cu film forming temperature is changed to 400° C. Next, pads are made in a passivation film 8 by PEP and RIE techniques and thereafter assembling is done. Finally, an aging process is carried out for 15 hours. Namely, at the final process after the assembly, the aging process is performed.

The inventors formed specimens at various temperature of the aging process (aging temperatures) in the above manufacturing method and measured the interconnection resistance of the Al interconnections for each specimen at room temperature by a four-terminal method. Furthermore, the inventors evaluated the EM resistance of the Al interconnection for each specimen by a conducting test at 225° C. with 2 MA/cm$^2$. The results are shown in Table 2. The EM test interconnection has both its ends terminated by a W via.

TABLE 2

| AGING TEMPERATURE | 100° C. | 120° C. | 150° C. | 200° C. | 250° C. | 300° C. | 350° C. | 380° C. | R.T. |
|---|---|---|---|---|---|---|---|---|---|
| INTERCONNECTION RESISTIVITY ($\mu\Omega$cm) | 3.1 | 2.8 | 2.8 | 2.8 | 2.9 | 3.0 | 3.0 | 3.2 | 3.1 |
| EM RESISTANCE | ⊚ | ⊚ | ⊚ | ⊚ | ⊚ | ⊚ | ⊚ | ⊚ | ⊚ |

It is seen from Table 2 that even when the Cu film forming temperature is as high as 400° C., the suitable aging process reduces the interconnection resistance. The reason why the interconnection decreases is that the suitable aging process enables Cu present in solid solution in the crystal grain of the Al interconnection 4 to precipitate again in the diffusion barrier layer in the crystal grain boundary.

It is desirable that the aging temperature should be 120° C. or above but 350° C. or below from the viewpoints of the Cu diffusion speed and the amount of Cu solid solution. Taking into account the decrease of the amount of Cu in the crystal grain, it is more preferable that the aging temperature should be about 200° C. higher than the solid solution limit of the GP zone.

Table 3 shows the relationship between the processing time (aging time) of the aging process and the interconnection resistance at an aging temperature of 200° C.

TABLE 3

| AGING TIME (hr.) | R.T. | 1 | 5 | 10 | 15 | 20 | 50 |
|---|---|---|---|---|---|---|---|
| INTERCONNECTION RESISTIVITY ($\mu\Omega$cm) | 3.2 | 3.1 | 3.0 | 2.9 | 2.8 | 2.8 | 2.8 |

The aging time is sufficient when the Cu concentration in the crystal grain boundary of the Al interconnection 4 becomes constant. That is, when the interconnection resistance of the Al interconnection 4 becomes constant, the aging time is sufficient. Although the aging time depends on the aging temperature, it is preferably 15 hours or more.

In the second embodiment, the Cu film forming temperature has been 400° C. The inventors' experiment has shown that use of the aging process even at temperatures other than 400° C. produced a better effect.

Third Embodiment

FIGS. 2A to 2D are sectional views showing a method of manufacturing semiconductor devices according to a third embodiment of the present invention. In FIGS. 2A to 2D, the same parts as those in FIGS. 1A to 1F are indicated by the same reference symbols and a detailed explanation of them will not be given.

First, the steps of FIGS. 1A to 1E in the first embodiment are carried out. The Cu film forming temperature is set to 400° C. After the substrate temperature has reached about 400° C., the formation of a Cu film 6 is started. The other conditions are the same as those in the first embodiment. As explained in the first embodiment, it is desirable that the Cu film forming temperature should be 150° C. or above but 400° C. or below, preferably 250° C. or above but 350° C. or below.

Next, as shown in FIG. 2A, a via hole and an interconnection groove connected to the via hole are made in a passivation film 8 on the Al interconnection 4 using PEP and RIE techniques. Then, after the natural oxide film on the surface of the Al interconnection 4 at the bottom of the via hole has been removed by plasma cleaning, a 15-nm-thick liner film 9 is formed on the whole surface by sputtering techniques so as to coat the inside face of the via hole and interconnection groove.

A TiN film, Nb film, and CuAl alloy film are used as the liner film 9 to form three types of specimens.

Next, as shown in FIG. 2B, a 800-nm-thick Al film 10 acting as an Al interconnection is formed on the whole surface by sputtering techniques in another chamber without breaking the vacuum, in such a manner that the Al film fills the via hole and the inside of the interconnection groove. Then, a 100-nm-thick Cu film 11 is formed on the Al film 10 at a film forming temperature of 400° C. by sputtering techniques in another chamber without breaking the vacuum. As explained in the first embodiment, it is desirable that the Cu film forming temperature should be 150° C. or above but 350° C. or below.

The Al film 10 is formed in two steps as follows. First, a first Al film of 400 nm thick is formed at room temperature by sputtering techniques. Then, a second Al film of 400 nm thick is formed by sputtering techniques (a reflow sputtering method) while the silicon substrate is being heated at as high as 450° C.

The degree of vacuum to which each chamber for forming each film (including the first Al film, second Al film, and Cu film 11) is to reach is set to $5 \times 10^{-6}$ Pa or below. The movement between the chambers is carried out in less than three minutes. This prevents an oxide film from being formed on the surface of each metal film, which allows Cu to diffuse with no interference.

As a result, θ phase layers ($CuAl_2$ layers) 7a are formed in the crystal grain boundary of the Al film 10 and θ phase layers 7b are formed in the crystal grain of the Al film 10 as shown in FIG. 2B. Moreover, the θ phase layers 7a have reached the bottom of the interconnection groove and the distance between them is less than the Blech critical length. On the other hand, the θ phase layers 7b have been formed only on the surface of the Al film and have reached neither the Al film 10 in the via hole nor Al film 10 in the interconnection groove.

Next, as shown in FIG. 2C, the Al film 10 and Cu film 11 formed on the passivation film 8 outside the via hole and interconnection groove are grounded and removed by CMP techniques using a slurry of Cu (e.g., quinaldic acid, hydrogen peroxide, colloidal silica, or water). As a result, the Al interconnection is divided into fine Al interconnections shorter than the Blech critical length, thereby forming embedded Al interconnections 10 electrically connected to the Al interconnection 4.

Since the θ phase layers 7b formed in the crystal grains at the surface of the Al film 10 have been removed, there are no θ phase layers 7b contributing to an increase in the interconnection resistance in the crystal grains of the Al interconnection 10.

Next, as shown in FIG. 2D, a 800-nm-thick passivation film 12 is formed on the whole surface. Finally, after a pad is made in the passivation film 12 by PEP and RIE techniques, assembling is done.

The inventors formed a 200-$\mu$m-long Al interconnection 4 and a 200-$\mu$m-long Al interconnection 10 alternately by the above-described method to produce a chain structure interconnection (specimen) whose total length was 2 mm. They evaluated the specimen by a conducting test at 255° C. with 2 MA/cm$^2$. The EM test interconnection has both its ends connecting to pads terminated by a W via.

As a result, a rise in the interconnection resistance was less than 10% of the initial interconnection resistance even after 100 hours of test, regardless of the type of liner film 9 (Tin film, Nb film, or CuAl alloy film).

After the test, the specimen using the CuAl alloy film as the liner film 9 was disassembled for examination. The result showed that Cu solid solution was present in neither the Al interconnection 4 nor the Al interconnection 10.

From the result, it is apparent that a highly reliable multilayer Al interconnection can be formed, regardless of whether the liner film is present.

Fourth Embodiment

A fourth embodiment of the present invention differs from the first embodiment in that, instead of the Cu film, a compound film (e.g., HfAl$_3$ film, TaAl$_3$ film, NbAl$_3$ film, Co$_4$Al$_3$ film, or TiAl$_3$ film) of a refractory metal (e.g., Ti, Hf, Ta, Nb, or Co) and Al is used as a diffusion source film for forming a diffusion barrier layer. Hf, Ta, Nb, and Co are refractory metals that take priority in diffusing in the crystal grain of the Al film.

In the fourth embodiment, the thickness of the compound film is set to 100 nm and the film forming speed to 1 nm/sec, as those of the Cu film in the first embodiment. To prevent the Al reflow from deteriorating due to the surface oxidation of the Al film 4 and allow the refractory metal to diffuse into the Al film 4, the process of forming the Al film 4, the process of forming each compound film, and the transfer of the specimen are carried out under a high vacuum of less than $5\times10^{-5}$ Pa. The other conditions are the same as those in the first embodiment.

Table 4 to Table 8 list the results of putting each specimen to the same tests as in the first embodiment.

TABLE 4

| Hf FILM FORMING TEMPERATURE | R.T. | 100° C. | 200° C. | 250° C. | 300° C. | 400° C. | 450° C. |
|---|---|---|---|---|---|---|---|
| INTERCONNECTION RESISTIVITY ($\mu\Omega$cm) | 2.7 | 2.7 | 2.7 | 2.8 | 2.8 | 2.9 | 3.0 |
| EM RESISTANCE | X | X | ○ | ⊙ | ⊙ | ⊙ | ⊙ |
| HIGH TEMPERATURE STORAGE TEST RESULT | 20 | 15 | 5 | 0 | 0 | 0 | 0 |

HfAl$_3$

TABLE 5

| Ta FILM FORMING TEMPERATURE | R.T. | 100° C. | 200° C. | 250° C. | 300° C. | 400° C. | 450° C. |
|---|---|---|---|---|---|---|---|
| INTERCONNECTION RESISTIVITY ($\mu\Omega$cm) | 2.7 | 2.8 | 2.8 | 2.8 | 2.9 | 3.1 | 3.2 |
| EM RESISTANCE | X | X | ○ | ⊙ | ⊙ | ⊙ | ⊙ |
| HIGH TEMPERATURE STORAGE TEST RESULT | 21 | 17 | 6 | 0 | 0 | 0 | 0 |

HfAl$_3$

TABLE 6

| Hf FILM FORMING TEMPERATURE | R.T. | 100° C. | 200° C. | 250° C. | 300° C. | 400° C. | 450° C. |
|---|---|---|---|---|---|---|---|
| INTERCONNECTION RESISTIVITY ($\mu\Omega$cm) | 2.7 | 2.8 | 2.9 | 2.9 | 3.0 | 3.2 | 3.3 |
| EM RESISTANCE | X | X | ○ | ⊙ | ⊙ | ⊙ | ⊙ |
| HIGH TEMPERATURE | 20 | 14 | 7 | 0 | 0 | 0 | 0 |

TABLE 6-continued

| Hf FILM FORMING TEMPERATURE | R.T. | 100° C. | 200° C. | 250° C. | 300° C. | 400° C. | 450° C. |
|---|---|---|---|---|---|---|---|
| STORAGE TEST RESULT | | | | | | | |

NbAl$_3$

TABLE 7

| Co FILM FORMING TEMPERATURE | R.T. | 100° C. | 200° C. | 250° C. | 300° C. | 400° C. | 450° C. |
|---|---|---|---|---|---|---|---|
| INTERCONNECTION RESISTIVITY ($\mu\Omega$cm) | 2.7 | 2.8 | 2.8 | 2.9 | 3.0 | 3.1 | 3.3 |
| EM RESISTANCE | X | X | ○ | ◎ | ◎ | ◎ | ◎ |
| HIGH TEMPERATURE STORAGE TEST RESULT | 19 | 1 | 7 | 0 | 0 | 0 | 0 |

Co$_4$Al$_3$

TABLE 8

| Ti FILM FORMING TEMPERATURE | R.T. | 100° C. | 200° C. | 250° C. | 300° C. | 400° C. | 450° C. |
|---|---|---|---|---|---|---|---|
| INTERCONNECTION RESISTIVITY ($\mu\Omega$cm) | 2.7 | 2.8 | 2.8 | 2.9 | 3.0 | 3.2 | 3.3 |
| EM RESISTANCE | X | X | ○ | ◎ | ◎ | ◎ | ◎ |
| HIGH TEMPERATURE STORAGE TEST RESULT | 21 | 16 | 10 | 0 | 0 | 0 | 0 |

TiAl$_3$

From these tables, it is apparent that the EM resistance of each specimen can be made high sufficiently by setting the film forming temperature of the compound film higher than 250° C. Since the Al interconnections are used, it is desirable that the film forming temperature of the compound film should be lower than 450° C. from the viewpoint of the reliability of the interconnections.

The result of the high temperature storage test has shown that the generation of a hillock in each specimen can be prevented completely by setting the film forming temperature of the compound film higher than 250° C.

With the film forming temperature of the compound film set higher than 250° C., a specimen was put to a high temperature storage test at 400° C. for 20 minutes ten times. The examination of the specimen after the test showed that no hillock was present in any specimen.

Specifically, it has been verified that setting the film forming temperature of the compound film higher than 250° C. achieves high thermal stability, assuring a sufficiently high reliability of interconnections in the multilayer interconnection processes.

While in the fourth embodiment, a compound film composed of a refractory metal and Al has been used, a compound film made of two or more refractory metals and Al or a compound film made of two or more refractory metals may be used.

Fifth Embodiment

In the first embodiment, the film forming speed the Cu film 6 (Cu film forming speed) is a parameter that changes the Cu diffusion time indirectly. Thus, controlling the Cu film forming speed enables the thickness of the diffusion barrier layer to be controlled.

The inventors formed specimens of the structure shown in FIG. 1, changing the film forming speed of the Cu film 6 (with a thickness of 100 nm) variously. They evaluated the interconnection resistance of the Al interconnection 4 and its EM resistance for each specimen by putting the specimen to the same test as in the first embodiment. The results are shown in Table 9 and Table 10.

TABLE 9

| | | Cu FILM FORMING SPEED | | | | | | |
|---|---|---|---|---|---|---|---|---|
| | | 1 Å/s | 5 | 10 | 20 | 30 | 50 | 100 |
| Cu FILM FORMING TEMPERATURE | 100° C. | X | X | X | X | X | X | X |
| | 150° C. | ○ | ○ | ○ | X | X | X | X |
| | 200° C. | ◎ | ○ | ○ | ○ | X | X | X |
| | 250° C. | ◎ | ◎ | ◎ | ◎ | ○ | X | X |

TABLE 9-continued

|  | Cu FILM FORMING SPEED | | | | | | |
|---|---|---|---|---|---|---|---|
|  | 1 Å/s | 5 | 10 | 20 | 30 | 50 | 100 |
| 300° C. | ◎ | ◎ | ◎ | ◎ | ○ | X | X |
| 400° C. | ◎ | ◎ | ◎ | ◎ | ◎ | ○ | X |
| 450° C. | ◎ | ◎ | ◎ | ◎ | ◎ | ◎ | ○ |

TABLE 10

|  |  | Cu FILM FORMING SPEED | | | | | | |
|---|---|---|---|---|---|---|---|---|
|  |  | 1 Å/s | 5 | 10 | 20 | 30 | 50 | 100 |
| Cu FILM | 100° C. | 2.7 | 2.7 | 2.7 | 2.7 | 2.7 | 2.7 | 2.7 |
| FORMING | 150° C. | 2.8 | 2.8 | 2.8 | 2.7 | 2.7 | 2.7 | 2.7 |
| TEMPERATURE | 200° C. | 3.1 | 2.9 | 2.8 | 2.8 | 2.8 | 2.7 | 2.7 |
|  | 250° C. | 3.1 | 3.0 | 2.9 | 2.9 | 2.8 | 2.7 | 2.7 |
|  | 300° C. | 3.2 | 3.0 | 2.9 | 2.9 | 2.8 | 2.7 | 2.7 |
|  | 400° C. | 3.2 | 3.1 | 3.1 | 2.9 | 2.9 | 2.8 | 2.7 |
|  | 450° C. | 3.3 | 3.2 | 3.2 | 3.1 | 3.0 | 3.0 | 2.9 |

To prevent the Al reflow from deteriorating due to the surface oxidation of the Al film 4 and allow the Cu to diffuse into the Al film 4 in producing a specimen, the process of forming the Al film 4, the process of forming the Cu film 6, and the transfer of the specimen were carried out under a high vacuum of less than $5 \times 10^{-5}$ Pa. This is particularly important for a diffusion source film whose film forming speed is low and which takes a long time for the film formation, like the Cu film 6. The other conditions are the same as those in the first embodiment.

To prevent the surface oxidation effectively, it is desirable that Ar introduced into the chamber during sputtering should have high purity and be lower than −90° C.

It is apparent from the tables that as the Cu film forming speed becomes slower at any Cu film forming temperature, or as the film forming time becomes longer, the EM resistance increases and the interconnection resistance decreases. Although a higher Cu film forming temperature is desirable, the higher Cu film forming temperature leads to an increase in the interconnection resistance.

In the fifth embodiment, the Cu film forming speed has been constant. The change of the film forming speed during film formation is no problem. For example, when the film forming speed has been made faster during film formation, the specimen has only to be kept at a high temperature for a specific time after the film formation.

Sixth Embodiment

In a sixth embodiment of the present invention, the optimum thickness of a Cu film is determined. When the thickness of the Cu film (Cu film thickness) is too thin, it is impossible to form diffusion barrier layers necessary to divide Al interconnections into fine Al interconnections whose length is less than the Blech length. On the other hand, when the Cu film is too thick, this leads to an increase in the interconnection resistance. Therefore, the Cu film thickness is one of the important parameters.

The inventors formed specimens of the structure shown in FIG. 1F, changing the thickness of the Cu film 6 variously in the first embodiment.

The Cu film forming speed was set to 1 nm/sec, the Cu film forming temperature 300° C., and the width of the interconnection groove 100 µm. The rest are the same as those in the first embodiment.

Table 11 lists the result of putting each specimen to the same tests as in the first embodiment, the CMP evaluation made to remove the Al film 4 outside the via hole and interconnection groove, and the average Cu concentration of the Al interconnection 4.

The CMP evaluation was made using the dishing amount (a percentage of the thickness of the Al film removed from the interconnection groove to the depth of the interconnection groove). The average Cu concentration was determined by making an analysis of a 200-µm region of the Al interconnection 4 using EDX.

TABLE 11

| Cu FILM THICKNESS (nm) | 1 | 2 | 5 | 10 | 30 | 50 | 100 | 300 | 500 |
|---|---|---|---|---|---|---|---|---|---|
| EM RESISTANCE | X | ○ | ○ | ◎ | ◎ | ◎ | ◎ | ◎ | ◎ |
| INTERCONNECTION RESISTIVITY (µΩcm) | 2.7 | 2.8 | 2.8 | 2.9 | 2.9 | 2.9 | 2.9 | 3.0 | 3.7 |
| HIGH TEMPERATURE STORAGE TEST RESULT | 20 | 5 | 3 | 0 | 0 | 0 | 0 | 0 | 0 |
| AVERAGE Cu CONCENTRATION (wt %) | 0.1 | 0.2 | 0.6 | 1.2 | 3.5 | 4.5 | 5.0 | 8.0 | 15 |

Since the maximum amount of Cu solid solution in Al at 300° C. is about 0.5 wt % from the Al—Cu equilibrium state diagram, a specimen whose average Cu concentration has exceeded the value has been ascribed to a diffusion barrier layer ($CuAl_2$ layer).

A comprehensive evaluation from Table 11 has shown that the Cu film thickness has to be more than 10 nm to form a sufficient diffusion barrier layer in the Al interconnection 4 when the Al film thickness is 800 nm. It is desirable that the average Cu concentration after the interconnection work should be 0.6 wt % or more, preferably 1.2 wt % or more but 8.0 wt % or less from the viewpoint of an increase in the interconnection resistance.

Although the 800-nm-thick Al film has been used, the Al film and the thinner Cu film may be made thinner by fining down the interconnection width and the interconnection depth. It is desirable that the Cu concentration after the patterning of the Al interconnection should have the aforementioned value.

The reason why the interconnection resistance is low, although the average Cu concentration in the Al interconnection is high, is that few θ phase layers and little Cu solid solution are present in the Al crystal grain but have precipitated in the crystal grain boundary. For example, the result of the EDX analysis showed that the Cu concentration in the crystal grain was 0.5 wt % or less.

As compared with the Al interconnection formed by the method of the sixth embodiment, the resistivity of the Al interconnection obtained by forming an Al film by reflow sputtering techniques using an Al-5 wt % alloy target and grinding the excess Al film by CMP techniques was as high as 4 µΩcm or more.

Seventh Embodiment

In the first embodiment, each film has been formed without breaking the vacuum. In a seventh embodiment of the present invention, after an Al film 4 is formed on the whole surface in such a manner that it fills the insides of the via hole and the interconnection groove, the specimen is exposed to air.

Before the formation of a Cu film 6, the surface of the Al film 4 is etched by RF plasma to remove the natural oxide film formed on the surface of the Al film 4. The exhaust pressure of the chamber during the etching is set to $5 \times 10^{-6}$ Pa or less, the supplied electric power 500W, and the etching time 30 seconds. The pressure of the introduced Ar gas is set to $3 \times 10^{-1}$ Pa.

After the etching, the specimen is transferred to a chamber for forming a Cu film 6 with a high vacuum retained. In the chamber, a 200-nm-thick Cu film 6 is formed at a Cu film forming temperature of 300° C. Thereafter, the processes are the same as those in the first embodiment.

The inventors formed specimens by the above manufacturing method, changing the interconnection width variously in the range from 0.2 to 10 $\mu$m when the interconnection length was 3 mm and the interconnection is an single layer. They put the Al interconnection 4 of each specimen to a conducting test at 225° C. with 2 MA/cm$^2$. The result of the test showed that no rise in the resistance of the Al interconnection was found in any specimen even when 2000 hours passed.

On the other hand, a specimen (comparative example) was formed by the same method as the above manufacturing method except that RF etching was not done before the formation of the Cu film 6. The specimen was put to the same conducting test. The result of the test showed that, when the interconnection width was 2 $\mu$m or more, the interconnection resistance increased by 100% or more before 1000 hours passed.

As a result of examining the specimen of the seventh embodiment and that of the comparative example by cross-sectional TEM and EDX analysis, it was found that Cu was prevented from diffusing because of the presence of a natural oxide film at the surface of the Al film 4 during the formation of the Cu film 6 in the specimen of the comparative example, and therefore the reliability of the interconnection was unable to increase. On the other hand, in the specimen of the seventh embodiment, it was verified that at least the natural oxide film on the surface of the grain boundary was removed by RF plasma etching.

From the results, it is apparent that the presence of a natural oxide film on the surface of the Al film 4 during the formation of the Cu film 6 prevents Cu from diffusing, thus impeding the formation of a diffusion barrier layer, and therefore the reliability of the interconnection cannot be increased.

To overcome this problem, it is necessary to remove the natural oxide film on the surface of the Al film 4 by RF plasma or the like and wash the surface, when the specimen has been exposed to the atmospheric air or a low vacuum after the formation of the Al film 4. It is desirable that, after the washing, the specimen should be transferred to a Cu film forming chamber under a high vacuum of $5 \times 10^{-5}$ Pa with a low oxygen-vapor partial pressure.

At a Cu film forming temperature other than 300° C., it is desirable that the surface should be washed when the specimen has been exposed to the atmospheric air.

When the natural oxide film was etched excessively using RF plasma, crystal defects occurred in the Al film 4. Thereafter, when a Cu film 6 was formed on the Al film 4, a θ phase layer was formed, with the defect as a starting point, and Cu was consumed in the crystal grain of the Al film 4. As a result, the supply of Cu to the crystal grain boundary of the Al film 4 became insufficient, preventing a diffusion barrier layer crossing the Al film 4 from being formed.

The results of various experiments conducted have shown that excessive crystal defects occurred in the Al film 4 when more than twice the amount of natural oxide film to be removed was removed or more than 1 W/cm$^2$ of electric power was supplied. Therefore, it is desirable that the amount of etching should be less than twice the amount of natural oxide film to be removed or less than 1 W/cm$^2$ of electric power should be supplied.

Furthermore, it is desirable that RF plasma etching to remove a natural oxide film should be based on RF-DC coupling (RF: 100 MHz). The reason is that the energy distribution half-value width of energy particles becomes small and the Al film 4 is etched by particles having almost equal energy, thus reducing the amount of crystal defects occurring in the Al film 4. This gives priority to Cu in the Cu film 6 in diffusing into the crystal grain boundary of the Al film 4, which suppresses the amount of Cu solid solution and the amount of layer precipitation as much as possible in the crystal grain of the Al film 4.

The problem may be solved by removing crystal defects occurring in the Al film 4. In an eighth embodiment of the present invention, a method of removing the crystal defects will be explained.

Eighth Embodiment

Figure 3A:
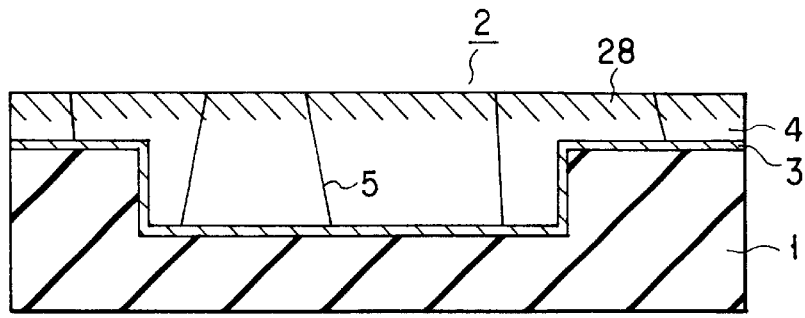
FIGS. 3A to 3C are sectional views showing a method of manufacturing semiconductor devices according to an eighth embodiment of the present invention.
Figure 3B:
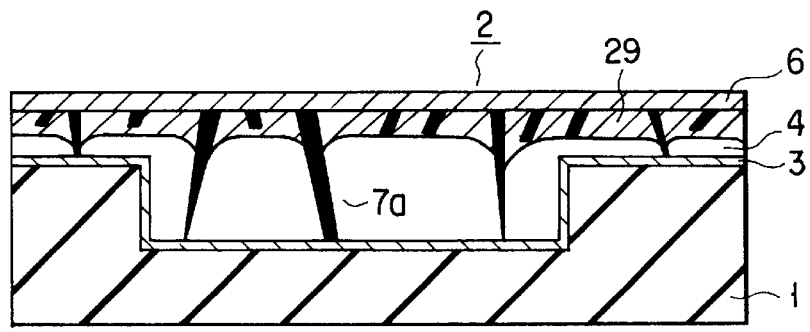
Figure 3C:
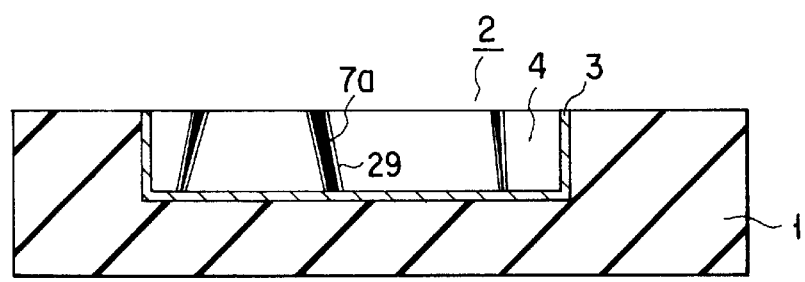

FIGS. 3A to 3C are sectional views showing a method of manufacturing semiconductor devices according to an eighth embodiment of the present invention.

First, the processes in FIGS. 1A to 1C of the first embodiment are carried out. Flattening is done by CMP techniques in such a manner that a 200-nm-thick Al film 4 is left on an interlayer insulating film 1 as shown in FIG. 3A. At this time, crystal defects have occurred at the surface of the Al film 4.

Next, By a heat treatment at 300° C. for 30 minutes, the crystal defects 28 in the Al film 4 occurred in the flattening process by CMP techniques are removed. The removal of the crystal defects 28 eliminates θ phase layer generating core sites in the crystal grain.

Then, as in the seventh embodiment, the natural oxide film formed on the surface of the Al film 4 is removed by RF plasma etching. The etching conditions are as follows: an electric power of 1 W/cm$^2$, an Ar pressure of $3 \times 10^{-1}$ Pa, and an exhaust pressure of $5 \times 10^{-6}$ Pa. Thereafter, as shown in FIG. 3B, a 100-nm-thick Cu film 6 is grown on the Al film 4 at high temperature in the Cu film forming chamber, with the specimen held in a high vacuum. The conditions for forming the Cu film 6 are as follows: an exhaust pressure of $1 \times 10^{-6}$ Pa, an Ar pressure of $3 \times 10^{-1}$ Pa, a film forming speed of 1 nm/sec, and a substrate temperature of 300° C. At this time, a θ phase layer 7b and a Cu solid solution layer 29 are formed on the surface of the Al film 4.

Next, as in the first embodiment, the excessive Cu film 6 including the θ phase layer 7b and Cu solid solution layer 29 are grounded by CMP techniques to embed the Al interconnection 4 as shown in FIG. 3C. Thereafter, as in the first embodiment, a 800-nm-thick interlayer insulating film is formed, which completes the processing.

In the above method, the interconnection length was fixed to 5 mm and the interconnection width was varied in the range from 0.2 to 10 $\mu$m. Then, the resistance of the Al interconnection 4 was measured. The result of the measurement showed a good resistance change rate of 0.5% or less after the resistivity conversion.

On the other hand, a similar Al interconnection was formed by the same method as the eighth embodiment except that the process of flattening the Al film 4 by CMP techniques was eliminated. The resistance of the Al interconnection was measured as described above. The result showed that the resistance change rate was about 1%.

The reason is that, when the flattened Al film 4 makes the thickness of the Al film on the interconnection groove equal even when the interconnection width varies, whereas the unflattened Al film 4 permits the thickness of the Al film 4 on the interconnection groove to differ when the interconnection width varies.

Specifically, in the eighth embodiment, the process of flattening the Al film 4 makes the distance from the bottom of the interconnection to the interface between the Al film 4 and the Cu film 6 constant, regardless of the interconnection width. This makes the resistance change rate smaller.

A modification of the eighth embodiment will be explained. In FIGS. 3A to 3C, flattening has been done by CMP techniques to leave a 200-nm-thick Al film 4 on the interlayer insulating film 1. In the modification, however, all the Al film 4 outside the interconnection groove 2 is removed by CMP techniques to form an embedded Al interconnection 4.

Next, as in the eighth embodiment, after the crystal defects (not shown) in the Al interconnection 4 are removed by a heat treatment at 300° C. for 30 minutes, the natural oxide film formed on the Al film 4 is removed by PF plasma etching.

Then, an Al film (a sacrifice film) is formed, with the high vacuum retained. A 100-nm-thick Cu film 6 is then formed on the Al film at a film forming speed of 1 nm/sec and a film forming temperature of 300° C. From this point on, the processes are the same as in the eighth embodiment. The resistance change rate of the Al interconnection in the modification was measured as in the eighth embodiment. The result showed that the resistance change rate was 0.5% or less.

Furthermore, the Al interconnection 4 whose both ends are terminated by a W via of the eighth embodiment and that of the modification were put to an EM test at 255° C. with 2 MA/cm$^2$. The result showed that the resistance change rate was 5% or less for both inter-connections even after 200 hours passed. Thus, the Al interconnection 4 of the eighth embodiment and that of the modification both have high reliability of interconnections.

Furthermore, an Al interconnection 4 was formed by the same method as the modification except that the process of forming an Al film (a sacrifice film) was eliminated. The Al interconnection 4 was put to the same EM test. The result showed that no rise in the resistance change rate was found even after 200 hours passed, achieving high reliability of interconnections, but the resistivity was as high as 4 $\mu m\Omega cm$.

The reason why the resistivity was very high in the comparative example is that the diffusion of Cu in the crystal grain of the Al interconnection 4 permitted a high-resistance Cu solution layer to develop and a θ phase layer to appear in the crystal grain of the Al interconnection 4.

On the other hand, the reason why the resistively became low in the modification is that the presence of the Al film (sacrifice film) on the Al interconnection 4 during the diffusion of Cu prevented Cu from diffusing into the crystal grain of the interconnection, which prevented a Cu solution layer or a θ phase layer from developing.

While in the eighth embodiment, the heat treatment has been carried out at 300° C. for 30 minutes to remove crystal defects acting as layer generating core sites, the heat treatment may be carried out under other conditions, as long as the crystal defects are removed.

It is desirable that the heat treatment temperature should be 450° C. or blow from the viewpoint of suppressing not only the occurrence of a hillock but also the deterioration of the SM resistance of the Al interconnection. In addition, it is desirable that the thickness of the Al film 4 left on the interlayer insulating film 1 in the process of FIG. 3A should be such that the Cu concentration in the crystal grain of the embedded Al interconnection 4 formed in the process of FIG. 3C is 0.5 wt % or less.

Ninth Embodiment

First, the processes in FIGS. 1A to 1D are carried out. The Cu film 6 is formed by applying no heat. The rest are the same as in the first embodiment.

Next, a 10-nm-thick Al film (oxidation preventing film) is formed on the Cu film 6. At this time, an exhaust pressure is kept at $5\times10^{-6}$ or below to prevent a natural oxide film acting as a barrier against the diffusion of Cu from developing on the surface of each metal film.

Next, by 10 minutes of heat treatment in normal pressure forming gas (10% $H_2$-90% $N_2$), Cu in the Cu film 6 is allowed to diffuse into the Al film 4. Thereafter, an Al interconnection 4 of the structure shown in FIG. 1F is formed in the same processes as in the first embodiment.

The inventors formed Al interconnections 4 of the structure shown in FIG. 1F by the above manufacturing method, changing the heat treatment temperature and time variously. The AL interconnections were put to a conducting test at 225° C. with 2 MA/cm$^2$. The results are listed in Table 12 and Table 13.

TABLE 12

| HEAT TREATMENT TEMPERATURE (° C.) | 150 | 200 | 250 | 300 | 350 | 400 |
|---|---|---|---|---|---|---|
| INTERCONNECTION RESISTIVITY ($\mu\Omega$cm) | 2.8 | 2.9 | 3.0 | 3.1 | 3.1 | 3.6 |
| EM RESISTANCE | X | ○ | ◉ | ◉ | ◉ | ◉ |

TABLE 13

| HEAT TREATMENT TIME (min.) | 5 | 10 | 15 | 90 | 600 | 1200 |
|---|---|---|---|---|---|---|
| INTERCONNECTION RESISTIVITY ($\mu\Omega$cm) | 2.8 | 2.9 | 2.9 | 2.9 | 3.0 | 3.5 |
| EM RESISTANCE | X | ○ | ◉ | ◉ | ◉ | ◉ |

From Table 12, it is desirable that the heat treatment temperature should be 200° C. or higher and the heat treatment time be 10 minutes or longer.

The 10-nm-thick Al film formed on the Cu film 6 is for preventing the oxidation of the Cu film 6 to allow Cu to diffuse. The Al film may have a thickness other than 10 nm, provided that it can prevent oxidation. In place of the Al film, use of a Ti film, a Ta film, or an Nb film produces a similar effect.

While the heat treatment has been carried out in normal pressure forming gas, it may be carried out at a reduced pressure or in a reducing gas atmosphere.

While in the ninth embodiment, the damascene processes have been explained, the present invention may be applied to dual damascene processes.

Tenth Embodiment

In a tenth embodiment of the present invention, the temperature of a heat treatment to form a diffusion barrier layer is lowered to suppress the deterioration of the SM resistance of the Al interconnection under a Cu film. Cu is activated without raising the temperature of the Al interconnection to promote the diffusion of Cu into the crystal grain boundary of the Al interconnection. This enables a diffusion barrier layer to be formed at low temperatures, while suppressing the diffusion of Cu into the crystal grain of the Al interconnection. As a result, a highly reliably Al interconnection with a low resistance is formed.

Specifically, the processes in FIGS. 1A to 1D are first carried out. The Cu film 6 is formed by applying no heat (or at room temperature). The rest are the same as in the first embodiment. An explanation of the tenth embodiment is about single damascene processes, the present invention applies to dual damascene processes.

Next, Cu in the Cu film 6 is diffused into the Al film 4 by heating Cu at 250° C. for five minutes in a reducing atmosphere with a hydrogen-oxygen partial pressure ratio (hydrogen/oxygen) of 30 and a total gas pressure of 10 Torr.

Then, as in the first embodiment, after the Al film 4 and Cu film 6 outside the interconnection groove 2 are grounded by CMP techniques to form an embedded single layer Al interconnection 4, a 800-nm-thick passivation film 8 is formed on the whole surface.

The Al interconnection 4 of the specimen in the tenth embodiment was put to a conducting test at 225° C. with 2 MA/cm$^2$. The result showed that no rise in the electrical resistance was observed even after 2000 hours passed and therefore the interconnection had high reliability.

On the other hand, instead of the heat treatment at 250° C. for five minutes in a reducing atmosphere with a hydrogen-oxygen partial pressure ratio (hydrogen/oxygen) of 30 and a total gas pressure of 10 Torr, a heat treatment was carried out under the same conditions in a vacuum. Then, the Al interconnection of the same specimen (comparative example) as in the tenth embodiment was put to the same conducting test. The result showed that the electrical resistance increased by 10% or more in less than 1000 hours.

The specimen of the tenth embodiment and that of the comparative example were examined by cross-sectional TEM. The result of the examination has shown that a θ phase layer was formed as far as the Al crystal layer boundary at the bottom of the interconnection groove in the specimen of the tenth embodiment, whereas a θ phase layer did not reach the Al crystal layer boundary at the bottom of the interconnection groove in the specimen of the comparative example and a diffusion barrier layer was not formed sufficiently.

The hydrogen/oxygen partial pressure ratio is not limited to the above value. Another value may be used, provided that an atmosphere in the heat treatment functions as a reducing atmosphere for Cu. Instead of hydrogen, another reducing agent, such as carbon monoxide, may be used.

Eleventh Embodiment

Figure 4A:
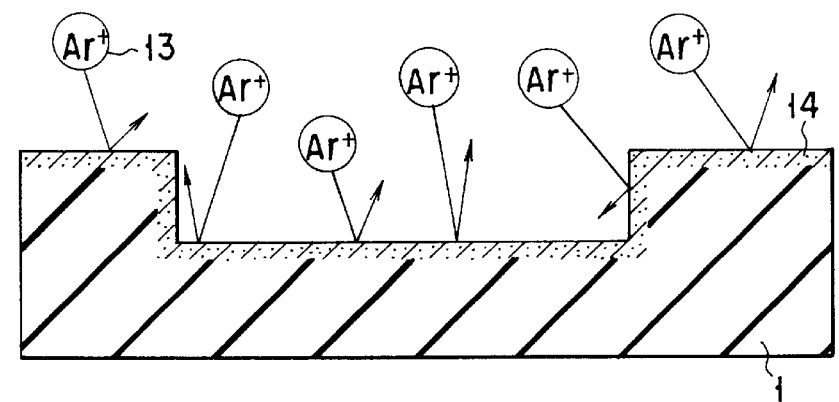
FIGS. 4A and 4B are sectional views showing a method of manufacturing semiconductor devices according to an eleventh embodiment of the present invention.
Figure 4B:
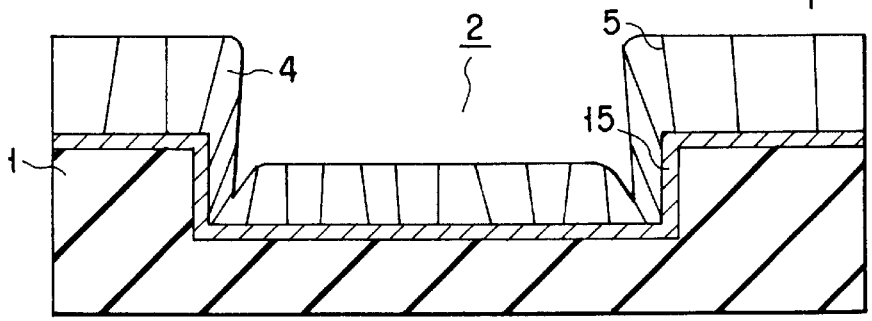

FIGS. 4A and 4B are sectional views showing a method of manufacturing semiconductor devices according to an eleventh embodiment of the present invention. The same parts as those in FIGS. 1A to 1F are indicated by the same reference symbols and a detailed explanation of them will not be given.

First, the process in FIG. 1A is carried out in the first embodiment. Next, plasma is produced by supplying RF power (the supplied power is, for example, 500W) under a vacuum (with an Ar pressure of, for example, 3×10$^{-1}$ Pa) with an exhaust pressure of 5×10$^{-6}$ Pa. By applying Ar ions 13 to the surface of the interlayer insulating film (SiO$^2$ film) 1 for 30 seconds as shown in FIG. 4A, part of the Si—O bonding at the surface of the interlayer insulating film 1 is dissociated to form a damage layer 14 at the surface of the interlayer insulating film 1. The damage layer 14 contains O having unconnected hands.

After the specimen is transferred to the chamber, with the high vacuum retained, an Al film 4 is formed.

Specifically, a 400-nm-thick Al film is formed by sputtering techniques without applying heat. Then, a 400-nm-thick Al film is formed by sputtering techniques (reflow sputtering techniques), while heating at 450° C. At this time, the exhaust pressure is 5×10$^{-6}$ Pa or less and the film forming Ar pressure is 3×10$^{-1}$ Pa.

Thereafter, a 100-nm-thick Cu film 6 is formed on the Al film 4 at a film forming temperature of 300° C. without breaking the vacuum. Thereafter, the processes are the same as those in the first embodiment.

FIG. 4B is a sectional view showing the stage at which the Al film 4 (corresponding to the Al 4 in FIG. 1A) is formed. The result of SIMS analysis has shown that an about 20-nm-thick mixture layer 15 of alumina and SiO has been formed on the surface of the interlayer insulting film 1. The reason why the alumina has been formed is that the unconnected hands of O in the damage layer 14 have connected to Al in the Al film 3.

After the specimen formed by the above manufacturing method was put to a high temperature storage test at 400° C. for 20 hours, the device characteristics were evaluated. The result of the evaluation showed that there was no operation problem stemming from the Al interconnection 4.

Furthermore, the Cu concentration in the inter-layer insulating film 1 under the Al interconnection was measured by SIMS. The result showed that the Cu concentration was lower than the sensing limit. From this, it is apparent that the manufacturing method of the eleventh embodiment enables the mixture layer 15 to prevent Cu from diffusing without providing a barrier film.

With the eleventh embodiment, the mixture layer 15 formed at the surface of the interlayer insulating film 1 improves the adhesion of the interlayer insulating film to the Al interconnection 4. The reason is that the mixture layer 15 contains aluminum.

Although aluminum contributes to a rise in the permittivity, since the mixture layer 15 also contains SiO, it suppresses the increase of the permittivity of the mixture layer 15. Actually, the result of measuring the permittivity showed that almost no rise in the permittivity was found.

In the eleventh embodiment, since the mixture layer 15 acting as a barrier film is formed in the interlayer insulating film 1, the cross-sectional area of the interconnection does not decrease. A decrease in the cross-sectional area of the interconnection contributes to a rise in the interconnection resistance.

Moreover, the mixture layer 15 has the advantage of being formed by the process of applying Ar ions 13 and the next process of forming an Al film 4, without using a high temperature process.

While in the eleventh embodiment, the Si—O bonding is dissociated by the RF plasma application of Ar, another plasma application, such as plasma application using ion gas, may be used to dissociate the Si—O bonding. Plasma application using ion gas also produces a similar effect to that of the eleventh embodiment.

Twelfth Embodiment

FIGS. 5A to 5E are sectional views showing a method of forming Al interconnections according to a twelfth embodiment of the present invention. The twelfth embodiment differs from the first embodiment in that a diffused layer is formed by an RTA heat treatment at high temperatures for a short time.

Figure 5A:
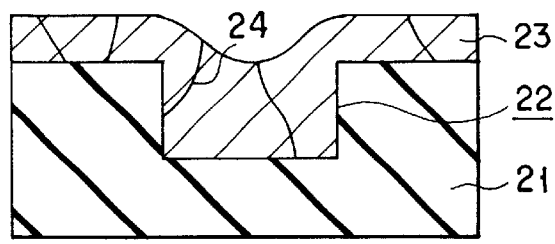
FIGS. 5A to 5E are sectional views showing a method of manufacturing semiconductor devices according to a twelfth embodiment of the present invention.

First, as shown in FIG. 5A, an interconnection groove 22 is formed in an interlayer insulating film 21. Then, a thick Al film 23 is formed on the whole surface so as to fill the inside of the interconnection groove 22. The Al film 23 may be an Al alloy film containing an addition, such as Cu, or a pure Al film. In FIG. 5A, numeral 24 indicates a crystal grain boundary.

Figure 5B:
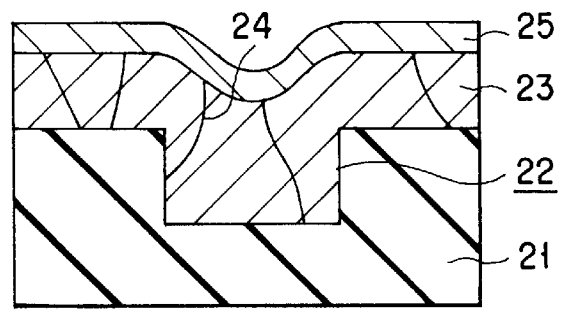

Next, as shown in FIG. 5B, a Cu film 25 is formed on the Al film 23. The thickness of the Cu film 25 varies depending on how dense the crystal grain boundaries are present in the Al film 23. It is desirable that the film thickness should be such that the amount of Cu added is 10 wt % or less.

The important point in the present process is that a natural oxide film preventing Cu from diffusing into the Al film 23 is kept from being formed at the interface between the Al film 23 and Cu film 25. To do this, a Cu film 25 should be formed successively without breaking the high vacuum after the formation of the Al film 23 in a high vacuum in which the generation of a natural oxide film is suppressed. Alternatively, a Cu film 25 should be formed after the natural oxide film formed on the surface of the Al film 23 has been removed.

Figure 5C:
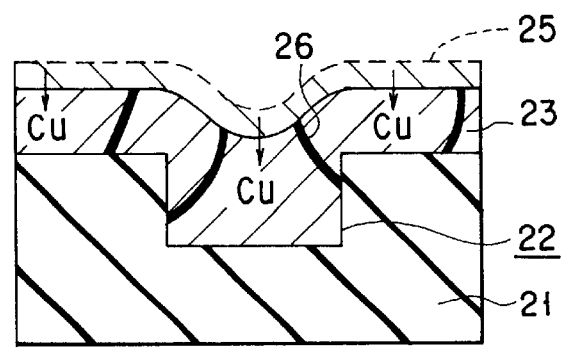

Next, as shown in FIG. 5C, by a heat treatment at 500° C. for 60 seconds, Cu in the Cu film 25 is given priority in diffusing into the crystal grain boundary 24 of the Al film 23 to form in the crystal grain boundary 24 an Al diffusion barrier layer 26 composed of materials whose main component is Cu or an AlCu alloy.

Since higher temperatures make thermal diffusion easier, the heat processing temperature should be high. However, when a heat treatment was carried out at higher than 548° C. (the eutectic point temperature of Al) for 30 seconds, the Al film 23 was recrystallized very easily, changing the surface state of the Al film 23 and the crystal grain boundary heavily, which was inappropriate to practical processes. Therefore, it is desirable that the thermal processing temperature should be lower then 548° C.

On the other hand, the lower limit of the thermal processing temperature is about 300° C. The first reason is that, since the thickness of the actual Al film 23 is in the range of 500 to 1500 nm, Cu can diffuse as far as the bottom of the Al film 23 in 60 seconds at that temperature. The second reason is that, when the heat treatment is carried out at high temperatures for a long time, undesirable situations, such as the recrystallization of excessive Al film 23 or the reaction of the interlayer insulating film 21 to the Al film 23 or Cu film 25, take place.

In a heat treatment time as short as several seconds to ten seconds, heat does not transmit uniformly to the Al interconnection because of the thermal capacity of the wafer. The result of experiments showed that a practical range is from 30 seconds to 60 seconds.

By such a high temperature, short time heat treatment, Cu diffuses throughout the Al film 23 at high speeds. After the heating or at the cooling stage, Cu selectively precipitates at high concentration in all the crystal grain boundaries of the Al film 23 in the form of Cu alone, an AlCu alloy, or both, thereby forming a diffusion barrier layer 26.

The reason why Cu selectively precipitates at high concentration in the crystal grain boundaries of the Al film 23 is that the crystal grain boundaries contain many crystal defects. Since the diffusion barrier layer 26 functions as a barrier against the Al grain diffusion caused by electromigration, it contributes to improvements in the reliability of interconnections. Moreover, since the diffusion barrier layer 26 is formed in all the crystal grain boundaries 24 of the Al film 23, the Al film 23 is very immune to faulty electromigration.

Figure 5D:
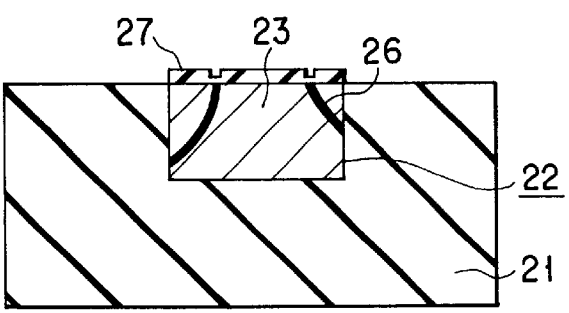
Figure 5E:
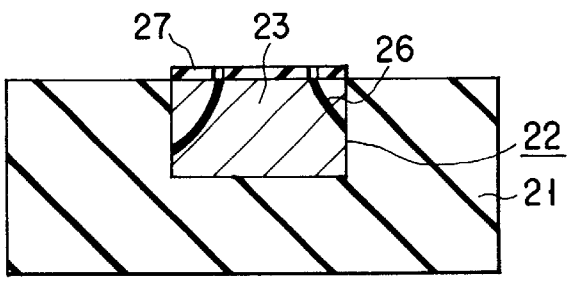

Next, as shown in FIG. 5D, an embedded Al interconnection 23 is formed by grinding the excessive Al film 23 outside the interconnection groove 22 by CMP techniques. At this time, a natural oxide film 27 is formed on the surface of the Al interconnection 23.

The natural oxide film 27 is thinner above the crystal grain boundary 24, a region where highly concentrated Cu exists and thicker above the Al interconnection 23 in the other regions. When a heat treatment is carried out with the natural oxide film 27 non-uniform in film thickness, hillocks are more liable to grow at a place where the natural oxide film 27 is thinner.

To overcome the problem, the natural oxide film 27 is exposed to oxygen plasma and allowed to become thicker until variations in the film thickness become sufficiently small as shown in FIG. 6E. This suppresses the growth of hillocks.

The twelfth embodiment produces a similar effect to that of the first embodiment. Furthermore, with the twelfth embodiment, because diffusion barrier layers 26 can be formed in all the crystal grain boundaries 24 of the Al film 23 in the process of FIG. 6C by a high-temperature, short-time heat treatment, an Al interconnection 23 very immune to electromigration can be formed. In addition, the exposure of the natural oxide film 27 to oxygen plasma suppresses the growth of hillocks due to variations in the film thickness of the natural oxide film 27.

While in the twelfth embodiment, single damascene processes have been explained, the present invention may be applied to dual damascene processes.

Thirteenth Embodiment

FIGS. 6A to 6E are sectional views showing a method of manufacturing semiconductor devices according to a thirteenth embodiment of the present invention. The same parts as those in FIGS. 1 and 2 are indicated by the same reference symbols and a detailed explanation of them will not be given.

Figure 6A:
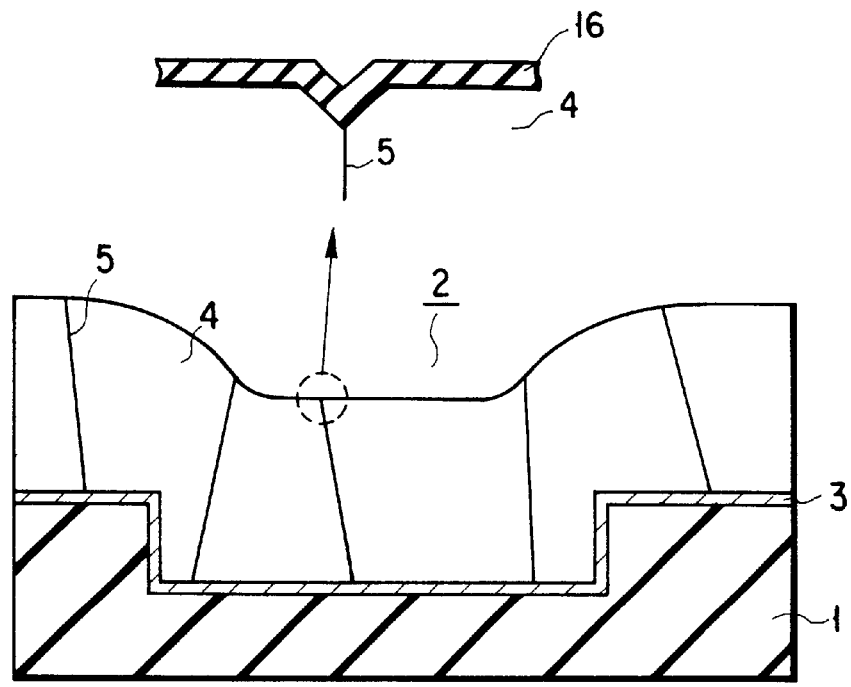

In the thirteenth embodiment, after the natural oxide film has been removed partially, a Cu film is formed. First, a first interlayer insulating film and a lower layer W interconnection are formed on the silicon substrate in which elements have been formed. Thereafter, as shown in FIG. 6A, a second interlayer insulating film 1 is formed so as to cover the lower layer W interconnection (not shown). Then, a via hole connected to the lower layer W interconnection and an interconnection groove 2 are made in the interlayer insulating film 1. In the via hole and interconnection groove 2, a liner film 3 made of Nb is formed. Then, an Al film 4 is formed by sputtering techniques to fill the via hole and interconnection groove 2 with the Al film 4. Thereafter, the silicon is exposed to the air to form a natural oxide film 16 on the surface of the Al film 4 as shown in FIG. 6A.

Figure 6B:
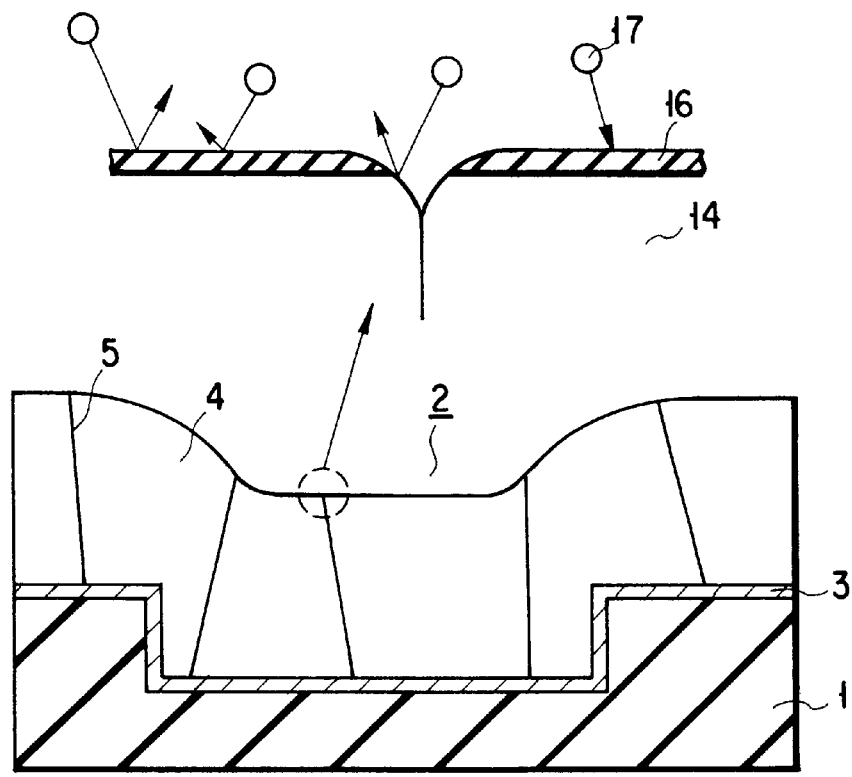

Next, as shown in FIG. 6B, Ar ions 13 are generated using RF plasma. The natural oxide film 16 is etched by Ar ions 13. The exhaust pressure of the chamber during the etching is set to $5 \times 10^{-6}$ Pa or less, the supplied electric power 200W, and the etching time 40 seconds. The pressure of Ar gas introduced to the chamber is set to $3 \times 10^{-1}$ Pa.

The amount of etching of the natural oxide film 16 under such conditions is 1 nm in terms of the thickness of the $SiO_2$ film. As shown in FIG. 6B, the natural oxide film 16 is not removed completely. Namely, the natural oxide film 16 is removed from the crystal grain boundary and its vicinity, but not removed from the other regions.

Next, with the high vacuum retained, the silicon substrate is transferred to the chamber for forming a Cu film. In the chamber, a 200-nm-thick Cu film 6 is formed at room temperature as shown in FIG. 6C.

Thereafter, to suppress the oxidation of the Cu film 6, a 10-nm-thick Al film 4a is formed on the Cu film 6 by sputtering techniques. The Al film 4a may be either a pure Al film or an Al—Cu alloy film. The thickness of the Al film 4a is not limited to the above value (10 nm). The Al film 4a may have another thickness, as long as it is thick enough to suppress the oxidation of the Cu film 6.

Next, a heat treatment is carried out at 300° C. for two hours to form a θ phase layer 7a as shown in FIG. 6D. The specimen at this stage was examined by cross-section TEM. The result showed that the θ phase layer 7a reached the liner film 3 but was not formed in the Al crystal grain. Moreover, the result of composition analysis by EDX showed that the amount of Cu in the Al crystal grain was less than the analysis limit. Namely, it is apparent that the diffusion of Cu into the Al crystal grain was suppressed as much as possible and the rise of the interconnection resistance was suppressed effectively.

The remaining processes are the same as those in the first embodiment. After the excessive metal film (Al film and Cu film) outside the interconnection groove 2 is removed by CMP, a passivation film 8 is formed on the whole surface as shown in FIG. 6E. The thickness of the passivation film 8 is, for example, 800 nm.

The inventors formed specimens by the above manufacturing method, changing the interconnection width variously in the range from 0.2 to 10 μm when the interconnection length was 200 μm. The AL interconnection 4 of each specimen were put to a conducting test at 225° C. with 2 $MA/cm^2$. The result showed that no rise in the resistance of the Al interconnection 4 was found in any specimen even when 200 hours passed. That is, the high EM resistance Al interconnection was achieved. The interconnection resistance was 2.8 μΩcm. The inventors have found that, as long as the amount of natural oxide film removed is in the range of 1 to 3 nm in terms of the thickness of $SiO_2$ film, a highly reliable Al interconnection is achieved similarly.

In contrast, a specimen with a Cu film 6 formed without removing the natural oxide film 16 was examined by cross-sectional TEM. The result showed that the natural oxide film 16 suppressed the diffusion of Cu, preventing a θ phase layer 7a from being formed in the Al film 4.

The result of analyzing the specimen showed that a θ phase layer was not formed in all the crystal grain boundaries and that a θ phase layer appeared in a random grain boundary (general boundary) and no θ phase layer was formed in a low energy crystal grain boundary. The phenomenon is considered to have occurred because, when the natural oxide film 16 was etched away, the etching of the natural oxide film 16 was not done well in the low energy crystal grain boundary and additionally the diffusion coefficient of the crystal grain boundary was small in etching.

It has been verified that, even when the amount of natural oxide film removed exceeds 3 nm in terms of the thickness of the $SiO_2$ film, if it is less than 5 nm, the formation of a θ phase layer in the crystal grain is suppressed in the manufacturing method of the thirteenth embodiment.

Since an area in which a θ phase layer is formed is limited to the crystal grain boundary in the manufacturing method of the thirteenth embodiment, the amount of Cu needed to form a θ phase layer is small. As a result, even when the thickness of the Cu film 6 is 100 nm, a highly reliable Al interconnection is obtained.

The heat treatment temperature in forming a θ phase layer should be 150° C. or higher but 400° C. or lower. Preferably, it should be 250° C. or higher but 350° C. or lower.

While in the manufacturing method of the thirteenth embodiment, the time of the heat treatment for forming a θ phase layer has been set to two hours, the heat treatment time may be made shorter, which makes the processing more efficient.

The manufacturing method of the thirteenth embodiment may be applied to the method of flattening the Al film and then forming a θ phase layer explained in the eighth embodiment. The resulting method produces a similar effect to that of the thirteenth embodiment.

Since the processes before the formation of the natural oxide film in the thirteenth embodiment are the same as in the first embodiment, the thickness of the Al film (a first layer Al film and a second layer Al film) is 800 nm. The Al film has only to have such a thickness as fills the interconnection groove. For example, it has been verified that a 600-nm-thick Al film produces a similarly good result.

Fourteenth Embodiment

When both ends of an interconnection are terminated in diffusion barrier layers, as W layers, that completely prevent Al from passing through, defects due to EM in multilayer Al interconnections result largely from the stress evolved at both ends of the interconnection. When the stress has reached the critical stress value of void generation, a void occurs. As the void grows, the interconnection resistance increases, finally leading to the breaking of the interconnection.

The time from when current starts to flow through the interconnection until the interconnection is broken depends chiefly on the time required for the stress developed at the ends of the interconnection to reach the critical stress value. The inventors determined effective parameters to prevent EM and their values using simulation, centering around the stress evolution. The simulation was basically the same as the method proposed by M. A. Korhonen, et al. (J. Appl. Phys. 73(3), 3790 (1993)). The calculation method will be described below.

When atomic movement in an interconnection is evaluated by EM, it is necessary to consider not only atomic movement using current as a driving force but also diffusion (back diffusion) using the stress gradient caused in the interconnection by the atomic movement as a driving force.

The amount of atomic movement was calculated on the assumption that a one-dimensional interconnection structure was used. FIG. 7 illustrates an element model of an interconnection. Table 14 lists various constants used in calculations. In FIG. 7, $J_{EM}$ is atomic flux induced by EM and $J_{SG}$ is atomic flux induced by stress gradient. $J_{EM}$ and $J_{SG}$ are expressed by the following equations:

$$J_{EM} = \frac{J_a N}{kT} j e \rho Z^* \quad (1)$$

$$J_{SG} = \frac{D_a}{kT} \frac{\partial \sigma(x)}{\partial x} \quad (2)$$

TABLE 14

| | |
|---|---|
| Boltzmann constant | $1.38 \times 10^{-16}$ erg/K |
| Elementaly Charge | $1.60 \times 10^{-19}$ C |
| Bulk Modulus of Aluminum | $7.81 \times 10^{11}$ erg/cm$^2$ |
| Lattice Constant of Aluminum (20° C.) | $4.05 \times 10^{-8}$ cm |
| Linear Expansion Coefficient of Aluminum | $2.30 \times 10^{-5}$ K$^{-1}$ |
| Electrical Resistivity of Aluminum | $2.66 \times 10^{-6}$ Ω·cm |
| Temperature Coefficient of Aluminum Resistivity | $4.20 \times 10^{-4}$ K$^{-1}$ |
| Diffusion Coefficient of Aluminum | $3 \times 10^{-12}$ cm$^2$/sec |
| Effective Charge Number (Z*) | $-5$ | where Da is the diffusion coefficient of aluminum (cm$^2$/sec), N is the atomic density (1/cm$^3$), T is the test interconnection temperature (K), j is the current density (A/cm$^2$), e is elementary charge, ρ is the resistivity of Al, Z* is the effective charge number of Al, ρ (x) is the stress (dyne/cm$^2$) in the longitudinal direction (x) of the interconnection, and k is the Boltzman's constant. The Al atomic density at X coordinate x and time t is expressed under continuos conditions using equation (1) and equation (2):

$$\frac{\partial}{\partial t} N(x, t) = -\frac{D_a}{kT} \frac{\partial}{\partial x} \left\{ j e \rho Z^*(z, t) - \frac{\partial}{\partial x} \sigma(x, t) \right\} \quad (3)$$

For the sake of simplification, if stress developed in the interconnection is isotropic stress as shown in equation (4), the relationship between the stress ρ (x, t) and the atomic density N(x, t) is expressed as:

$$E_{xx} = E_{yy} = E_{zz} = E_{iso} \quad (4)$$

$$\sigma(x, t) = (C_{11} + C_{12}) E_{iso} \quad (5)$$

$$\frac{N_0}{N(x, t)} = \frac{V}{V_0} = 1 + 3E_{iso} = 1 + 3\frac{\sigma_x(x, t)}{(C_{11} + C_{12})} \quad (6)$$

$$\sigma_x(x, t) = \frac{1}{3}(C_{11} + C_{12})\left(\frac{N_0}{N(x, t)} - 1\right) \quad (7)$$
$$= B\left(\frac{N_0}{N(x, t)} - 1\right)$$

where ε iso is isotropic strain, $C_{11}$ and $C_{12}$ are elastic constants, B is the bulk modulus, $N_0$ is the atomic density in the standard state, and $V_0$ is the volume in the standard state. The stress distribution in the interconnection is determined by solving equation (3) using equation (7).

As seen from equation (3), the diffusion coefficient Da and effective charge number Z* used are parameters having a great effect on the calculated values. The diffusion coefficient is set at $3 \times 10^{-12}$ (cm$^2$/s) and the effective charge number Z* is set at $-5$.

In calculation, the segment length dx is set at 0.25 μm. The Al atomic flux induced by the electron wind ($J_{EM}$) and induced by the stress change ($J_{SG}$) of each segment were calculated at intervals of 0.5 second. The initial stress of the interconnection at 225° C. was assumed to be an isotropic tensile stress of 300 MPa and the critical stress of void generation was assumed to be 1.25 GPa at the Al/SiO$_2$ interface.

In addition to the above calculation approach, simulation was made by causing a diffusion barrier layer (θ phase layer) to develop in the interconnection. In the simulation, the position at which the diffusion barrier layer developed was fixed to x=10 μm and the width of the θ phase layer was changed. The effect of the diffusion coefficient and thickness of the diffusion barrier layer on the EM life of the interconnection was examined by making simulations while changing the material for the diffusion barrier layer and its diffusion coefficient.

When the diffusion barrier layer is a θ phase layer, not a W layer, Al can diffuse in the diffusion barrier layer. In the case of Al multilayer interconnection with the via hole filled with W, it is the cathode end that is most affected by EM in the interconnection. Therefore, the service life of the interconnection was derived from the stress value at the cathode end.

FIG. 8 shows the relationship between the EM stress at the cathode end and the EM stress time (testing time) when the thickness of the θ phase layer is set at 0.5 μm. From the figure, it is understood that, when the EM stress has increased to some extent, the EM stress increases almost linearly with the increase of the EM stress time, regardless of the ratio ($D_θ/D_{Al}$) of the diffusion coefficient $D_θ$ of the θ phase layer to the diffusion coefficient $D_{Al}$ of Al.

Figure 9:
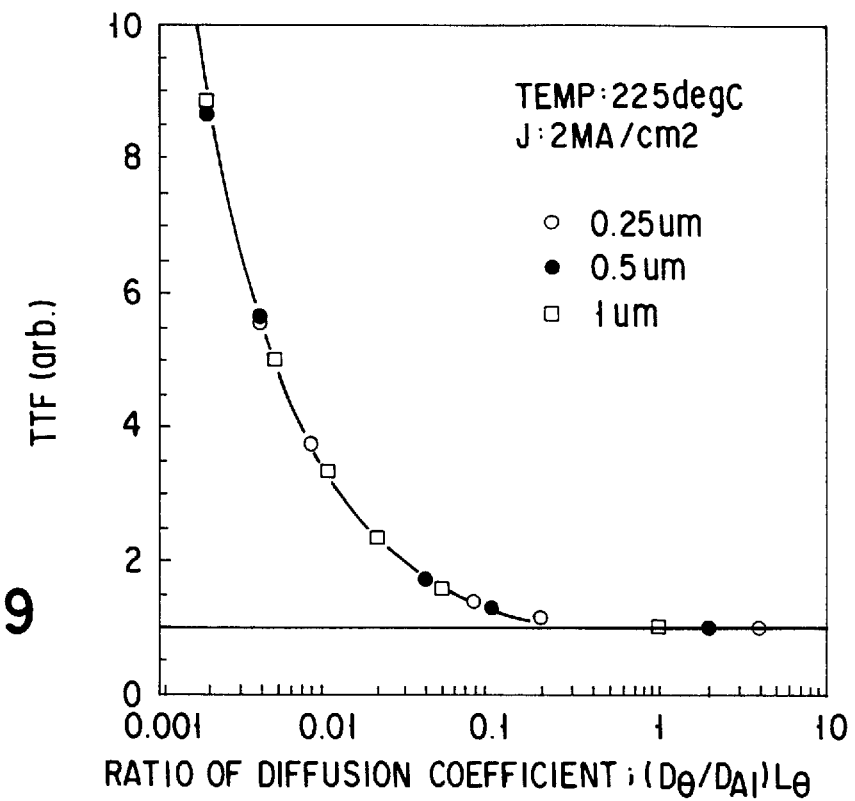
FIG. 9 shows the dependence of the TTF of each Al interconnection differing in the average layer thickness $L_\theta$ on $(D_\theta/D_{Al})/L_\theta$.

FIG. 9 shows the dependence of the TTF (Time To Failure) of each Al interconnection differing in the average thickness of the θ phase layer in the longitudinal direction of the interconnection (the average layer thickness $L_θ$) on $(D_θ/D_{Al})/L_θ$.

TTF is a value obtained by standardizing the testing time (the EM life of the interconnection) by the EM life of an interconnection without a θ phase layer, when the stress at the cathode end has reached the critical stress value of 1.15 GPa at the cathode end.

The thickness of the θ phase layer was determined using arithmetic means. Specifically, it was found by dividing the sum of the thickness of the θ phase layer on the top surface of the interconnection and the thickness of the θ phase layer on the bottom surface of the interconnection by 2. Dividing the total sum of the thickness of each θ phase layer thus determined by the number of θ phase layers gives the average layer thickness $L_θ$.

Since the EM stressing time is approximated to almost a straight line, a rise in the EM stress yields a similar result to that of FIG. 9, even when the critical stress has changed from 1.25 GPa.

As seen from the figure, the service life of the interconnection is improved, regardless of the thickness of the θ phase layer, if the following expressing is fulfilled:

$$(D_θ/D_{Al})/L_θ \leq 0.1 \quad (8)$$

Specifically, it is apparent that the service life of the interconnection can be evaluated uniformly using the parameter $(D_θ/D_{Al})/L_θ$.

The result of examining the effect of the thickness of the θ phase layer will be explained.

A method of forming specimens used in the experiments will be explained. A first interlayer insulating film, a lower layer w interconnection, and a second interlayer insulating film are formed in a silicon substrate in which elements have been formed. Then, a via hole and an interconnection groove are made in the second interlayer insulating film. A liner film is then formed in the via hole and interconnection groove. Thereafter, the via hole and interconnection groove are filled with the Al film by the reflow of Al. Then, the Al film is exposed to the air to form a natural oxide film on the surface of the Al film.

Thereafter, Ar ions are generated in a chamber using RF plasma. The natural oxide film is etched by Ar ions.

At this time, the pressure of Ar introduced into the chamber is $3\times10^{-1}$ Pa and the exhaust pressure at the silicon substrate surface in the chamber is $5\times10^{-6}$ Pa or less. The supplied electric power and etching time are controlled so that the amount of natural oxide film etched may be 0.5 to 1 nm in terms of the thickness of the $SiO_2$ film.

The natural oxide film etched under the above conditions was observed by in situ Auger. The result showed that only the natural oxide film at the crystal grain boundary and its vicinity were removed.

Next, with the high vacuum retained, the silicon substrate is transferred to the chamber for forming a Cu film. In the chamber, a 200-nm-thick Cu film is formed on the Al film. Thereafter, to suppress the oxidation of the Cu film, a 10-nm-thick Al film is formed on the Cu film. The Al film may be either a pure Al film or an Al—Cu alloy film. The Al film may have another thickness, as long as it is thick enough to suppress the oxidation of the Cu film.

Next, by a heat treatment under the conditions (temperature and time) listed in Table 15, a θ phase layer is formed. Table 15 also lists the average layer thickness $L_\theta$ of the θ phase layers present in a 100-μm-long interconnection. The average layer thickness $L_\theta$ was determined from the result of observation by cross-sectional TEM. The θ phase layers to be calculated were those extending from the top surface of the interconnection to the liner film at the bottom surface of the interconnection. Those not reaching the liner film, or those not crossing the interconnection completely were left out of the layers to be calculated.

Moreover, the result of the observation showed that no θ phase layer was formed in the Al crystal grain. The reason why no θ phase layer was formed is that the natural oxide film remained on the crystal surface of the Al film even after the natural oxide film was etched, and this suppressed the diffusion of Cu. The distance between θ phase layers was within almost 10 μm in all the test conditions and less than the Blech length.

TABLE 15

| AMOUNT OF ETCHING (nm) | 0.5 | 0.5 | 0.5 | 1 | 1 |
|---|---|---|---|---|---|
| HEAT TREATMENT TEMPERATURE (° C.) | 300 | 300 | 300 | 300 | 300 |
| HEAT TREATMENT TIME (min) | 5 | 10 | 30 | 30 | 180 |
| Lθ (μm) | 0.013 | 0.03 | 0.063 | 0.25 | 1.25 |
| EM RESISTANCE | 1 | 1.5 | 1.8 | 3 | 9 |

Next, after the excessive Cu film and Al film outside the interconnection groove are removed by CMP, a 800-nm-thick passivation film is formed on the whole surface.

Each specimen thus formed whose interconnection width was 0.5 μm or 10 μm and whose interconnection length was 200 μm were put to a conducting test at 225° C. with 2 MA/cm². The results are listed in Table 15.

From the results, $D_\theta/D_{Al}$ was calculated. The result showed that the calculated value was almost $2.5\times10^{-3}$ for any average layer thickness ($L_\theta$) and fell on the curve of FIG. 9. Since the result of the simulation of FIG. 9 conforms to the result of the experiment, it is understood that the formation of a θ phase layer whose average layer thickness fulfills equation (8) improves the reliability of interconnections.

The result of the test showed that many θ phase layers took the form of a reversed triangle. Making the thickness of the θ phase layer more equal decreases the substantial value of $D_\theta/D_{Al}$, thereby achieving the same EM resistance with a thinner θ phase layer.

While in the fourteenth embodiment, the diffusion barrier layer has been a θ phase layer, another layer may be used as a diffusion barrier layer, provided that in the diffusion barrier layer, the mutual diffusion coefficient of Al is smaller than the self diffusion coefficient of Al. Such a diffusion barrier layer produces a similar effect to that of the fourteenth embodiment.

While in the fourteenth embodiment, damascene interconnections have been explained, use of RIE interconnections also improves the reliability of interconnections, provided that a θ phase layer that fulfills equation (8) is formed. The reason is that in the above simulation, no parameter unique to damascene interconnections was used.

And the diffusion barrier layer also suppress the long-distance diffusion of voids, stress-migration can be prevented.

Fifteenth Embodiment

FIGS. 10A to 10D are sectional views showing a method of manufacturing semiconductor devices according to a fifteenth embodiment of the present invention. The fifteenth embodiment differs chiefly from the above embodiments in that the natural oxide film formed on the surface of the Al film is not etched and a Cu film is formed on the Al film.

Figure 10A:
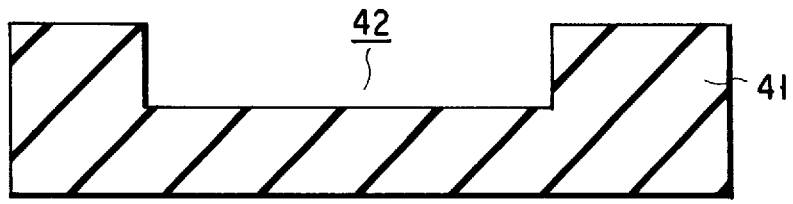
FIGS. 10A to 10D are sectional views showing a method of manufacturing semiconductor devices according to a fifteenth embodiment of the present invention.

First, as shown in FIG. 10A, an interlayer insulating film 41 is formed on a silicon substrate (not shown) in which elements have been formed integrally.

Figure 10B:
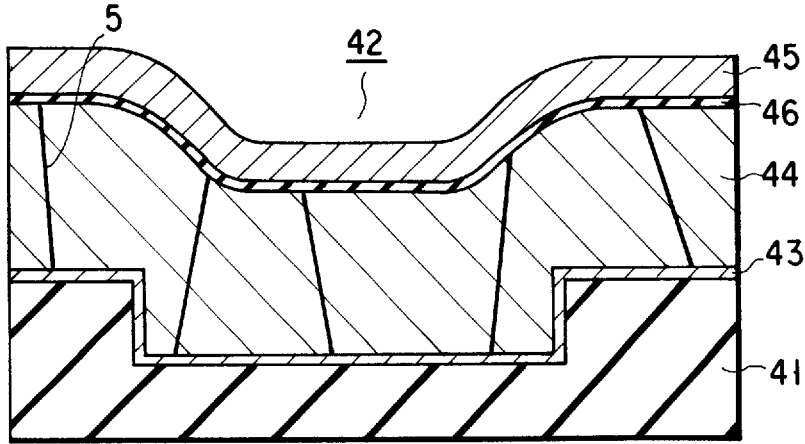
Figure 10C:
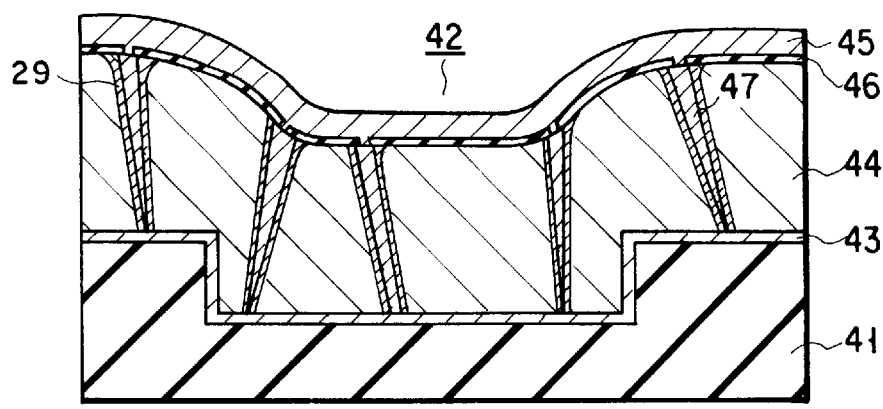
Figure 10D:
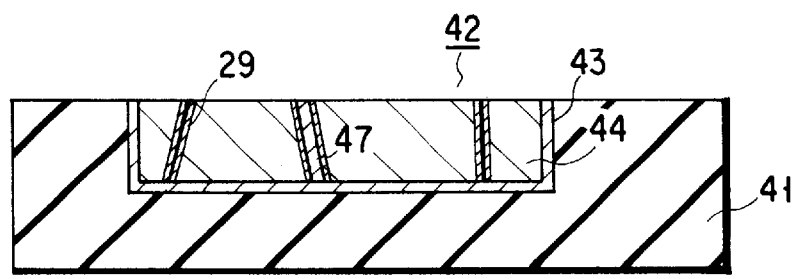

Next, a liner film 43 is formed on the interlayer insulating film 41 as shown in FIG. 10B. Then, an Al film 44 acting as an Al interconnection is formed on the whole surface by reflow sputtering techniques so as to fill an interconnection groove 42. On the Al film 44, a Cu film 45 acting as a diffusion source film is formed.

Depending on the film forming unit, the Al film 44 and Cu film 45 may not be formed successively in a vacuum. In this case, since the Al film 44 is exposed to the air once after the formation of the Al film 44, a natural oxide film 46 is formed on the surface of the Al film 44. The silicon substrate (wafer) is introduced into the film forming unit after it has been washed with water. During the washing, a natural oxide film 46 is also formed on the surface of the Al film 44.

The natural oxide film (hereinafter, referred to as the Al natural oxide film) formed on the Al surface is a strong film. When the Al natural oxide film 46 exists between the Al film 44 and Cu film 45, Cu in the Cu film 45 does not diffuse into the Al film 44 easily.

In the above-described embodiments, to overcome such a drawback, Cu is allowed to diffuse into the Al film after all the Al natural oxide film has been etched away, or after part of the Al natural oxide film, that is, the Al natural oxide film at the Al grain boundary where the film is easily etched and its vicinity has been etched away.

In contrast, in the fifteenth embodiment, a Cu film 45 is formed with the Al natural oxide film 46 remaining unchanged, as shown in FIG. 10B. Then, Cu in the Cu film 45 is caused to diffuse into the Al film 44 by a heat treatment at a temperature higher than a specific temperature at which the Al natural oxide film 46 is destroyed partially. This form a diffusion barrier layer (θ phase layer) 47 in the Al film 44. The diffusion barrier layer 47 is made of Cu or a Cu—Al alloy and prevents EM.

At this time, because the destruction of the Al natural oxide film 46 begins at the portion above the grain boundary, Cu is given priority in diffusing into the Al grain boundary.

Figure 11:
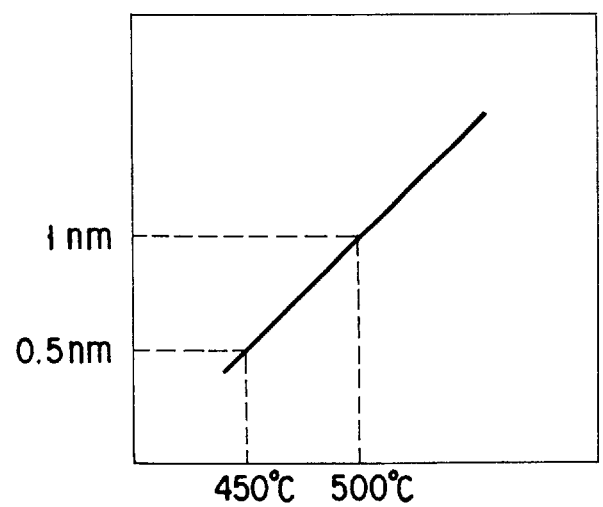
FIG. 11 shows the relationship between the heat treatment temperature to diffuse Cu into the Al film and the thickness of the Al natural oxide film.

As shown in FIG. 11, the heat treatment temperature required to cause Cu to diffuse into the Al film 44 rises as the Al natural oxide film is thicker. Usually, when the Al film 44 is left in the air for several tens of hours at room temperature after the formation of the Al film, Cu diffuses easily into the Al film 44 by a heat treatment at 450° C.

When the Al film 44 is left for a longer time, or when the Al film 44 is washed in water, the thickness of the Al natural oxide film 46 can exceed 1 nm. In these cases, a heat treatment at 500° C. or higher enables Cu to diffuse into the Al film 44.

Since a high-temperature heat treatment applies a heavier load on the elements, it is desirable that a high-temperature, short-time heat treatment, such as RTP (Rapid Thermal Process), should be used. Use of RTP suppresses the deterioration of the elements. The temperature of the heat treatment must be set below 548° C. (the eutectic point temperature of Al).

After the formation of a θ phase layer 37, the excessive Al film 44, Cu film 45, and Al natural oxide film 46 outside the interconnection groove 4 are removed by CMP techniques as shown in FIG. 12D. In the fifteenth embodiment, because the Al film 44, Cu film 45, together with the Al natural oxide film 46, are removed, the number of processes does not increase. Thereafter, a passivation film is formed.

As described above, in the fifteenth embodiment, even when the Al natural oxide film 46 is present on the Al film 44, a Cu film 45 is formed without removing the Al natural oxide film 46. Then, a heat treatment causes Cu to diffuse into the Al film 44, while destroying part of the Al natural oxide film 46, thereby forming a diffusion barrier layer 47.

Therefore, the natural oxide film 46 may be formed during the time from when the Al film 44 has been formed until a Cu film starts to be formed. Therefore, the Al film 44 may be left in an atmosphere of normal air, after the Al film 44 has been formed.

Furthermore, the Al natural oxide film 46 need not be removed after a normal cleaning, such as washing in water. In addition, the oxide film formed on the surface of the Al film 44 need not be removed after the process of positively oxidizing the surface of the Al film 44, such as a plasma oxidation process or a heat treatment in an atmosphere of oxygen.

Since the process of removing the Al natural oxide film 46 before the formation of the Cu film 45 is not necessary, the manufacturing processes can be simplified. Moreover, because neither a film forming unit for forming the Al film 44 and Cu film 45 successively in a vacuum nor a film forming unit for etching the Al natural oxide film 46 is necessary, the manufacturing cost can be reduced.

Sixteenth Embodiment

Figure 12A:
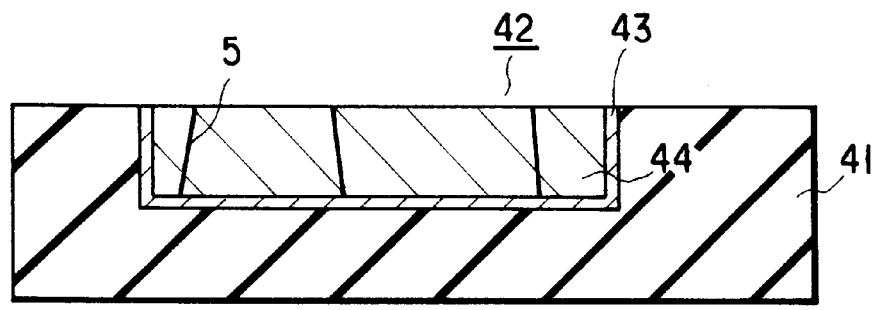
FIGS. 12A to 12C are sectional views showing a method of manufacturing semiconductor devices according to a sixteenth embodiment of the present invention.
Figure 12B:
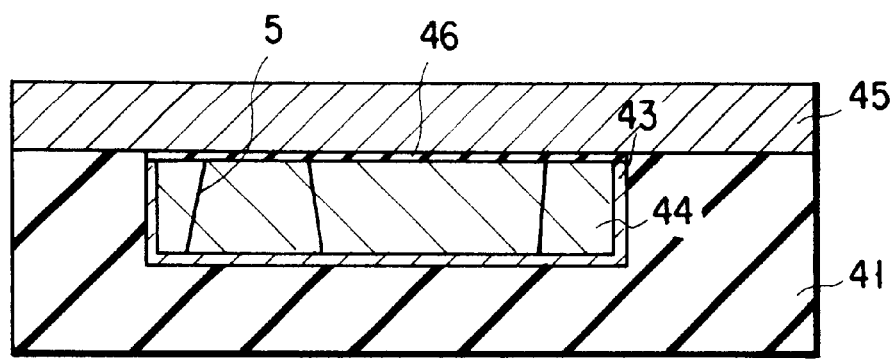
Figure 12C:
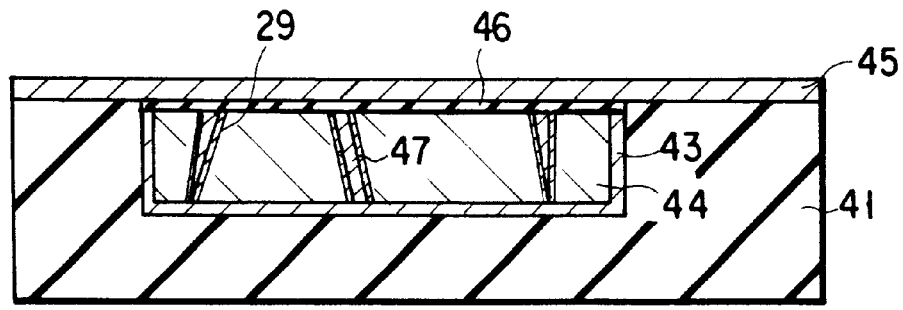

FIGS. 12A to 12C are sectional views showing a method of manufacturing semiconductor devices according to a sixteenth embodiment of the present invention. In FIGS. 12A to 12C, the same parts as those in FIGS. 10A to 10D are indicated by the same reference symbols and a detailed explanation of them will not be given.

In the sixteen embodiment, a θ phase layer 45 is formed after the formation of the Al interconnection. As shown in FIG. 12A, an interlayer insulating film 41 with an interconnection groove 42, a liner film 43, and an Al interconnection 44 are formed by a known method on a silicon substrate (not shown) in which elements have been formed integrally.

Then, after the silicon substrate in the Al film forming chamber has been exposed to the air, it is transferred to a Cu film forming chamber. In this chamber, a Cu film 45 is formed as shown in FIG. 12B. Since the silicon has been exposed to the air, the Cu film 45 is formed on the Al interconnection 44 via the Al natural oxide film 46 as shown in FIG. 12B.

Next, as shown in FIG. 12C, Cu in the Cu film 44 is caused to diffuse into the Al film 44 by the same heat treatment as in the fifteenth embodiment, thereby selectively forming a diffusion barrier layer 47 in the grain boundary of the Al interconnection 44.

Thereafter, the process of removing the Cu film 45 and Al natural oxide film 46 by CMP techniques is carried out, followed by the process of forming a passivation film, as in the fifteenth embodiment.

As with the fifteenth embodiment, with the sixteenth embodiment, a θ phase layer 47 can be formed in the Al interconnection 44 without the etching process of removing only the Al natural oxide film 46. Therefore, the sixteenth embodiment produces a similar effect to that of the fifteenth embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device manufacturing method comprising the steps of:

forming an interlayer insulating film on a semiconductor substrate;

making a connection hole in said interlayer insulating film;

filling an inside of said connection hole with a conductive film which is made of a first substance, being thicker than the depth of said connection hole, and having a crystal grain boundary;

forming on said conductive film which is thicker than the depth of said connection hole, a diffusion source film which is made of a second substance and thereby forming a diffusion barrier layer against said first substrate;

forming a diffusion barrier layer in said connection hole against said first substance in said crystal grain boundary by causing said second substance to selectively diffuse into said crystal grain boundary at the same time or after the time of formation of said diffusion source film so as to divide said conductive film into regions shorter than the Blech critical length by using said diffusion barrier layer, and selectively forming a solid solution layer of said second substance in a region of said conductive film which is located outside the connection hole; and removing said conductive film, said solid solution layer and said diffusion source film outside said connection hole to form an interconnection composed of said conductive film in said connection hole without including said solid solution layer.

2. A semiconductor device manufacturing method according to claim 1, wherein said conductive film and diffusion source film outside said connection hole are removed by CMP techniques.

3. A semiconductor device manufacturing method according to claim 2, wherein the size of the crystal grains in said conductive film is thermally stabilized at the same time or after the time of formation of said conductive film, and then said diffusion source film is formed.

4. A semiconductor device manufacturing method according to claim 3, wherein said conductive film is subjected to a heat treatment at a higher temperature than the film forming temperature of said conductive film, when the size of the crystal grains in said conductive film is thermally stabilized after the formation of said conductive film.

5. A semiconductor device manufacturing method according to claim 2, wherein the atmosphere in which said semiconductor substrate exists after the process of thermally stabilizing the crystal grains in said conductive film until the process of forming said diffusion source film is set to a high vacuum of $6 \times 10^{-5}$ Pa or less.

6. A semiconductor device manufacturing method according to claim 2, wherein said first substance is one of Al and Al alloy, and said second substance is mainly made of one of Cu and Cu—Al alloy.

7. A semiconductor device manufacturing method according to claim 2, wherein said conductive film is formed in said connection hole via one of Ti film, TiN film, TiN/Ti film, TiW film, Nb film, Ta film, and TaAl film.

8. A semiconductor device manufacturing method according to claim 2, wherein the step of forming said conductive film includes the step of heating said semiconductor substrate to form a first conductive film and the step of forming a second conductive film on said first conductive film without heating said semiconductor substrate.

9. A semiconductor device manufacturing method according to claim 2, wherein said diffusion source film is formed with heating said semiconductor substrate and said second substance is allowed to diffuse at the same time said diffusion source film is formed.

10. A semiconductor device manufacturing method according to claim 9, wherein a temperature at which said diffusion source film is formed falls within a range of 150° C. to 400° C.

11. A semiconductor device manufacturing method according to claim 2, wherein a surface of said interconnection is oxidized after said conductive film and said diffusion source film outside said connection hole was removed by CMP techniques.

12. A semiconductor device manufacturing method according to claim 11, wherein the surface of said interconnection is oxidized by oxygen plasma processing.

13. A semiconductor device manufacturing method according to claim 2, wherein said connection hole is one of a interconnection groove made in said interlayer insulating film and through hole/interconnection groove combinations composed of a interconnection groove made in said interlayer insulating film and an interconnection groove made in said interlayer insulating film and connected to said through hole.

14. A semiconductor device manufacturing method according to claim 2, wherein an aging process is carried out after the process of removing the said portion of said conductive film and diffusion source film outside said connection hole.

15. A semiconductor device manufacturing method according to claim 14, wherein said aging process is carried out in the temperature range from 120° C. to 250° C.

16. A semiconductor device manufacturing method according to claim 14, wherein said aging process is carried out for not less than 15 hours.

17. A semiconductor device manufacturing method according to claim 2, wherein said first substance is Al, and said second substance is one of a refractory metal, a compound of refractory metals, and a compound of a refractory metal and Al.

18. A semiconductor device manufacturing method according to claim 17, wherein said refractory metal is one of Ti, Co, Nb, Ta, and Hf.

19. A semiconductor device manufacturing method according to claim 2, wherein a temperature at which said diffusion source film is formed falls within a range of 250° C. to 450° C.

20. A semiconductor device manufacturing method according to claim 2, wherein the Cu concentrations in said interconnection made of said conductive film falls within a range of 1.2 wt % to 8.0 wt %.

21. A semiconductor device manufacturing method according to claim 2, wherein said diffusion source film is formed after the removal of an oxide film, when said oxide film has been formed on the surface of said conductive film at the time of forming said diffusion source film.

22. A semiconductor device manufacturing method according to claim 21, wherein said oxide film is removed by plasma etching.

23. A semiconductor device manufacturing method according to claim 21, wherein said oxide film is removed by RF plasma etching and an amount of etching of said conductive film by said RF plasma etching is set to less than twice the thickness of said oxide film.

24. A semiconductor device manufacturing method according to claim 21, wherein said oxide film is removed by RF plasma etching and the supplied electric power to generate said RF plasma is set to less than 1 W/cm$^2$.

25. A semiconductor device manufacturing method according to claim 2, wherein part of an oxide film on the grain boundary in said conductive film is removed, when the oxide film is formed on a surface of said conductive film at the time of forming said diffusion source film.

26. A semiconductor device manufacturing method according to claim 2, wherein said conductive film is flattened, the crystal defects occurred in said conductive film as a result of the flattening are removed, an oxide film is removed when the oxide film has been formed on the surface of said conductive film, said diffusion source film is formed on said conductive film with heating said substrate, and said interconnection is formed.

27. A semiconductor device manufacturing method according to claim 2, wherein a part of said conductive film outside said connection hole is removed, the crystal defects occurred in said conductive film as a result of the removal are removed, an oxide film is removed when the oxide film has been formed on the surface of said conductive film, a conductive film composed of the same material as said conductive film is formed on said conductive film at a higher temperature than the film forming temperature of said conductive film, said diffusion source film is formed with heating said substrate, and said interconnection is formed.

28. A semiconductor device manufacturing method according to claim 26, wherein said diffusion source film is formed at a temperature not less than 150° C.

29. A semiconductor device manufacturing method according to claim 27, wherein said diffusion source film is formed at a temperature not less than 150° C.

30. A semiconductor device manufacturing method according to claim 2, wherein said diffusion source film is formed without heating said semiconductor substrate and then said second substance in said diffusion source film is diffused in said conductive film by a heat treatment to form said diffusion barrier layer.

31. A semiconductor device manufacturing method according to claim 26, wherein said diffusion source film is formed without heating said semiconductor substrate and then said second substance in said diffusion source film is diffused in said conductive film by a heat treatment to form said diffusion barrier layer.

32. A semiconductor device manufacturing method according to claim 27, wherein said diffusion source film is formed without heating said semiconductor substrate and then said second substance in said diffusion source film is diffused in said conductive film by a heat treatment to form said diffusion barrier layer.

33. A semiconductor device manufacturing method according to claim 30, wherein said diffusion source film is formed without heating said semiconductor substrate, an oxidation preventing film is formed on said diffusion source film, and then said heat treatment is carried out.

34. A semiconductor device manufacturing method according to claim 31, wherein said diffusion source film is formed without heating said semiconductor substrate, an oxidation preventing film is formed on said diffusion source film, and then said heat treatment is carried out.

35. A semiconductor device manufacturing method according to claim 32, wherein said diffusion source film is formed without heating said semiconductor substrate, an oxidation preventing film is formed on said diffusion source film, and then said heat treatment is carried out.

36. A semiconductor device manufacturing method according to claim 30, wherein said diffusion source film is formed without heating said semiconductor substrate, an oxidation preventing film mainly made of one of Al, Ta, Ti, and Nb is formed on said diffusion source film, and then said heat treatment is carried out.

37. A semiconductor device manufacturing method according to claim 31, wherein said diffusion source film is formed without heating said semiconductor substrate, an oxidation preventing film mainly made of one of Al, Ta, Ti, and Nb is formed on said diffusion source film, and then said heat treatment is carried out.

38. A semiconductor device manufacturing method according to claim 32, wherein said diffusion source film is formed without heating said semiconductor substrate, an oxidation preventing film mainly made of one of Al, Ta, Ti, and Nb is formed on said diffusion source film, and then said heat treatment is carried out.

39. A semiconductor device manufacturing method according to claim 2, wherein said diffusion barrier layer is formed after the formation of said diffusion source film without heating said substrate, and then by diffusing said second substance in said diffusion source film into said conductive film by a heat treatment in an atmosphere that includes oxidizing gas and reducing gas against said second substance and has the capability of reducing said second substance as a whole.

40. A semiconductor device manufacturing method according to claim 2, wherein one of an Al film and an Al alloy film is used as said conductive film, a Cu film is used as said diffusion source film, and after said Cu film is formed, said diffusion barrier layer is formed by diffusing Cu in said Cu film into one of said Al film and said Al alloy film by using a rapid thermal process.

41. A semiconductor device manufacturing method according to claim 40, wherein said rapid thermal process is such that the heat treatment time falls within a range of 30 seconds to 60 seconds, and the heat treatment temperature in not less than a temperature at which the Cu diffusion distance within said heat treatment time corresponds to a length equivalent to the thickness of one of said Al film and said Al alloy film.

42. A semiconductor device manufacturing method according to claim 41, wherein said heat treatment temperature falls within a range of 300° C. to a eutectic point temperature of Al or less.

43. A semiconductor device manufacturing method according to claim 40, wherein a natural oxide film is not allowed to intervene in the interface between one of said Al film and said Al alloy film, and said Cu film.

44. A semiconductor device manufacturing method according to claim 40, wherein the thickness of the oxide film on the surface of said interconnection is equalized by subjecting the surface of said interconnection to oxygen plasma processing after the formation of the interconnection made of one of said Al film and said Al alloy film in said connection hole.

* * * * *

UNITED STATES PATENT AND TRADEMARK OFFICE
CERTIFICATE OF CORRECTION

PATENT NO.    : 6,403,462 B1
DATED         : June 11, 2002
INVENTOR(S)   : Hasunuma et al.

It is certified that error appears in the above-identified patent and that said Letters Patent is hereby corrected as shown below:

Title page,
Item [57], ABSTRACT,
Line 1, change "the this" to -- the --.

Column 33,
Lines 49 and 51, change "a interconnection" to -- an interconnection --.

Signed and Sealed this

Twenty-fifth Day of March, 2003

JAMES E. ROGAN
*Director of the United States Patent and Trademark Office*